United States Patent
Nishida

(10) Patent No.: US 11,996,347 B2
(45) Date of Patent: May 28, 2024

(54) SEMICONDUCTOR DEVICE

(71) Applicant: FUJI ELECTRIC CO., LTD., Kawasaki (JP)

(72) Inventor: Yuhei Nishida, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 205 days.

(21) Appl. No.: 17/746,069

(22) Filed: May 17, 2022

(65) Prior Publication Data

US 2022/0375818 A1 Nov. 24, 2022

(30) Foreign Application Priority Data

May 24, 2021 (JP) ................................ 2021-086663

(51) Int. Cl.
*H01L 23/48* (2006.01)
*H01L 23/373* (2006.01)
*H01L 23/495* (2006.01)

(52) U.S. Cl.
CPC .... *H01L 23/3735* (2013.01); *H01L 23/49534* (2013.01)

(58) Field of Classification Search
CPC .......... H01L 23/49534; H01L 23/3735; H01L 23/49811; B23K 1/20
See application file for complete search history.

(56) References Cited

U.S. PATENT DOCUMENTS

| | | | | |
|---|---|---|---|---|
| 2004/0089928 A1* | 5/2004 | Nakajima | ............... | H01L 24/32 257/E23.044 |
| 2006/0091512 A1* | 5/2006 | Shinohara | ........... | H01L 23/4334 257/E23.044 |
| 2016/0268154 A1 | 9/2016 | Hiraoka et al. | | |
| 2021/0020554 A1 | 1/2021 | Hinata et al. | | |

FOREIGN PATENT DOCUMENTS

| | | |
|---|---|---|
| EP | 3093882 A1 | 11/2016 |
| JP | H04-162759 A | 6/1992 |
| JP | H10-4156 A | 1/1998 |
| JP | 2002-299495 A | 10/2002 |
| JP | 2007-273661 A | 10/2007 |
| JP | 2009-094135 A | 4/2009 |
| JP | 2015-128154 A | 7/2015 |
| JP | 2021-019064 A | 2/2021 |
| WO | 2015/104954 A1 | 7/2015 |
| WO | 2015/132969 A1 | 9/2015 |

* cited by examiner

*Primary Examiner* — Hoa B Trinh
(74) *Attorney, Agent, or Firm* — Rabin & Berdo, P.C.

(57) ABSTRACT

A semiconductor device has a resistance element including a metal block, a resin layer disposed on the metal block, and a resistance film disposed on the resin layer and an insulated circuit board including an insulating plate and a circuit pattern disposed on the insulating plate and having a bonding area on a front surface thereof to which a back surface of the metal block of the resistance element is bonded. The area of the circuit pattern is larger in plan view than that of a front surface of the resistance element. The metal block has a thickness greater than that of the circuit pattern in a direction orthogonal to the back surface of the metal block.

(Continued)

As a result, the metal block properly conducts heat generated by the resistance film of the resistance element to the circuit pattern.

18 Claims, 20 Drawing Sheets

SEMICONDUCTOR DEVICE

CROSS-REFERENCE TO RELATED APPLICATION

This application is based upon and claims the benefit of priority of the prior Japanese Patent Application No. 2021-086663, filed on May 24, 2021, the entire contents of which are incorporated herein by reference.

BACKGROUND OF THE INVENTION

1. Field of the Invention

The embodiments discussed herein relate to a semiconductor device.

2. Background of the Related Art

Semiconductor devices include semiconductor chips used as a power converter. The semiconductor chips are insulated gate bipolar transistors (IGBTs), power metal oxide semiconductor field effect transistors (MOSFETs), or the like. Such a semiconductor device includes in a case at least semiconductor chips, external connection terminals, and an insulated circuit board over which the semiconductor chips and external connection terminals are arranged. Each part is sealed with a sealing member in the case. The insulated circuit board includes an insulating plate, circuit patterns formed over the front surface of the insulating plate, and a metal plate formed on the back surface of the insulating plate. The semiconductor chips and the external connection terminals are bonded to the front surfaces of the circuit patterns with solder. Furthermore, the back surface of the metal plate of the insulated circuit board is exposed on the back surface of the semiconductor device (see, for example, Japanese Laid-open Patent Publication No. 2021-019064).

With the above semiconductor device a resistance element is arranged over a circuit pattern and a circuit including the resistance element is formed. By doing so, a potential between electrodes is measured. The resistance element is a shunt resistor or the like. A shunt resistor includes a resin layer and a resistance film and electrodes formed thereover. Furthermore, with the shunt resistor the resin layer is formed over a metal block in order to dissipate heat.

However, even if the shunt resistor simply includes the metal block, the shunt resistor which generates heat is not sufficiently cooled. If heat generated by the shunt resistor is transferred to surroundings, then the heat dissipation property of the whole semiconductor device deteriorates. This leads to deterioration in the reliability of the semiconductor device.

SUMMARY OF THE INVENTION

According to an aspect, there is provided a semiconductor device, including: a resistance element including a metal block, a resin layer disposed on the metal block, and a resistance film disposed on the resin layer; and an insulated circuit board including an insulating plate, and a circuit pattern having a front surface, the circuit pattern being disposed on the insulating plate and having a bonding area on the front surface of the circuit pattern to which a back surface of the metal block of the resistance element is bonded, an area of the circuit pattern being larger in a plan view of the semiconductor device than an area of the resistance element, wherein the metal block has a thickness greater than a thickness of the circuit pattern in a direction orthogonal to the back surface of the metal block.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Embodiments will now be described by reference to the accompanying drawings. In the following description a "front surface" and an "upper surface" indicate an X-Y plane of a semiconductor device 1 of FIG. 1 which faces the upper side (+Z direction). Similarly, an "upside" indicates the upward direction (+Z direction) of the semiconductor device 1 of FIG. 1. A "back surface" and a "lower surface" indicate the X-Y plane of the semiconductor device 1 of FIG. 1 which faces the lower side (−Z direction). Similarly, a "downside" indicates the downward direction (−Z direction) of the semiconductor device 1 of FIG. 1. These terms mean the same directions at need in the other drawings. The "front surface," the "upper surface," the "upside," the "back surface," the "lower surface," the "downside," and a "side" are simply used as expedient representation for specifying relative positional relationships and do not limit the technical idea of the present disclosure. For example, the "upside" and the "downside" do not always mean the vertical direction relative to the ground. That is to say, the directions indicated by the "upside" and the "downside" are not limited to the gravity direction. Furthermore, in the following description a "main component" indicates a component contained at a rate of 80 volume percent (vol %) or more.

First Embodiment

Figure 1:
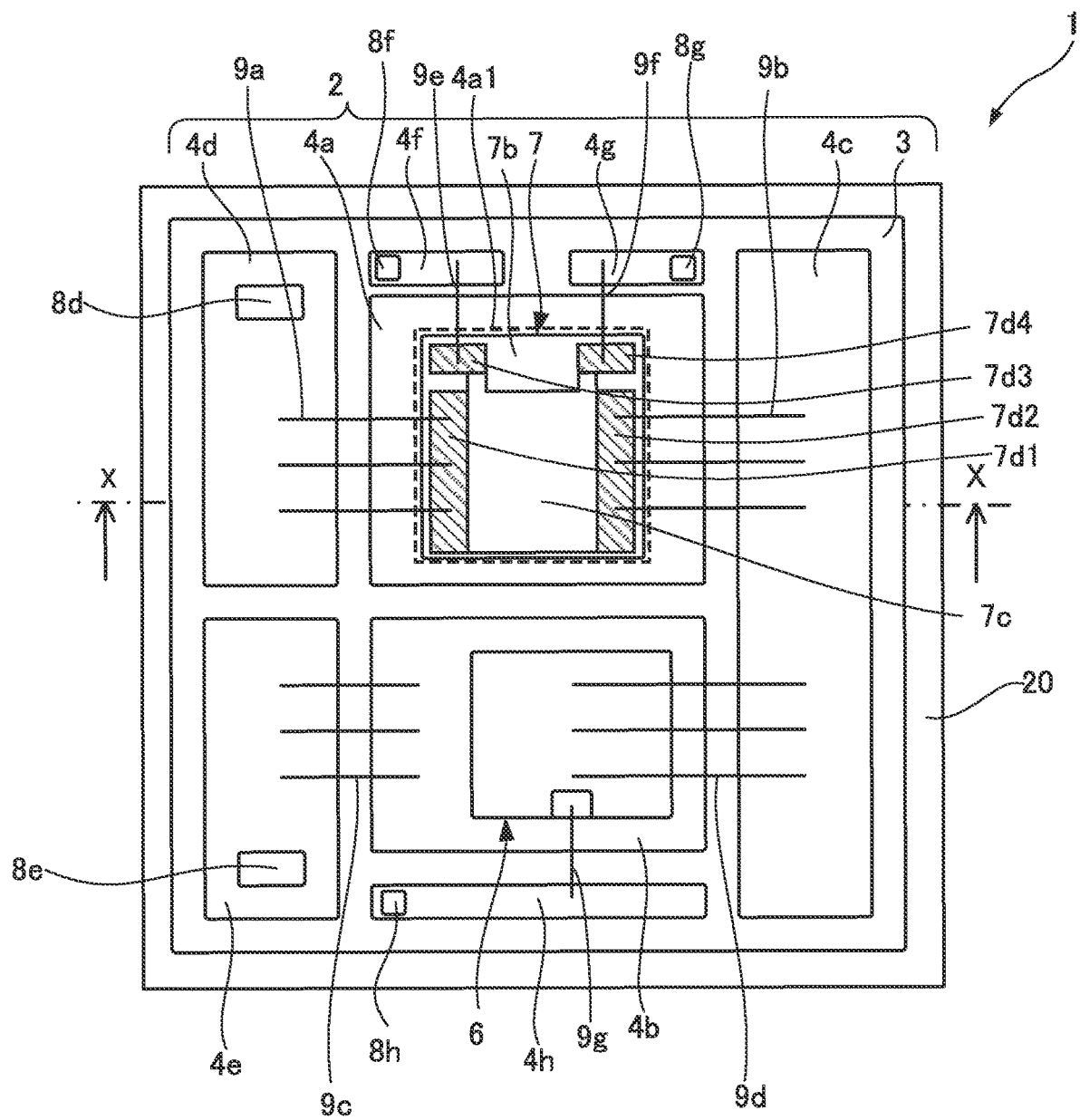
FIG. 1 is a plan view of a semiconductor device according to a first embodiment.
Figure 2:
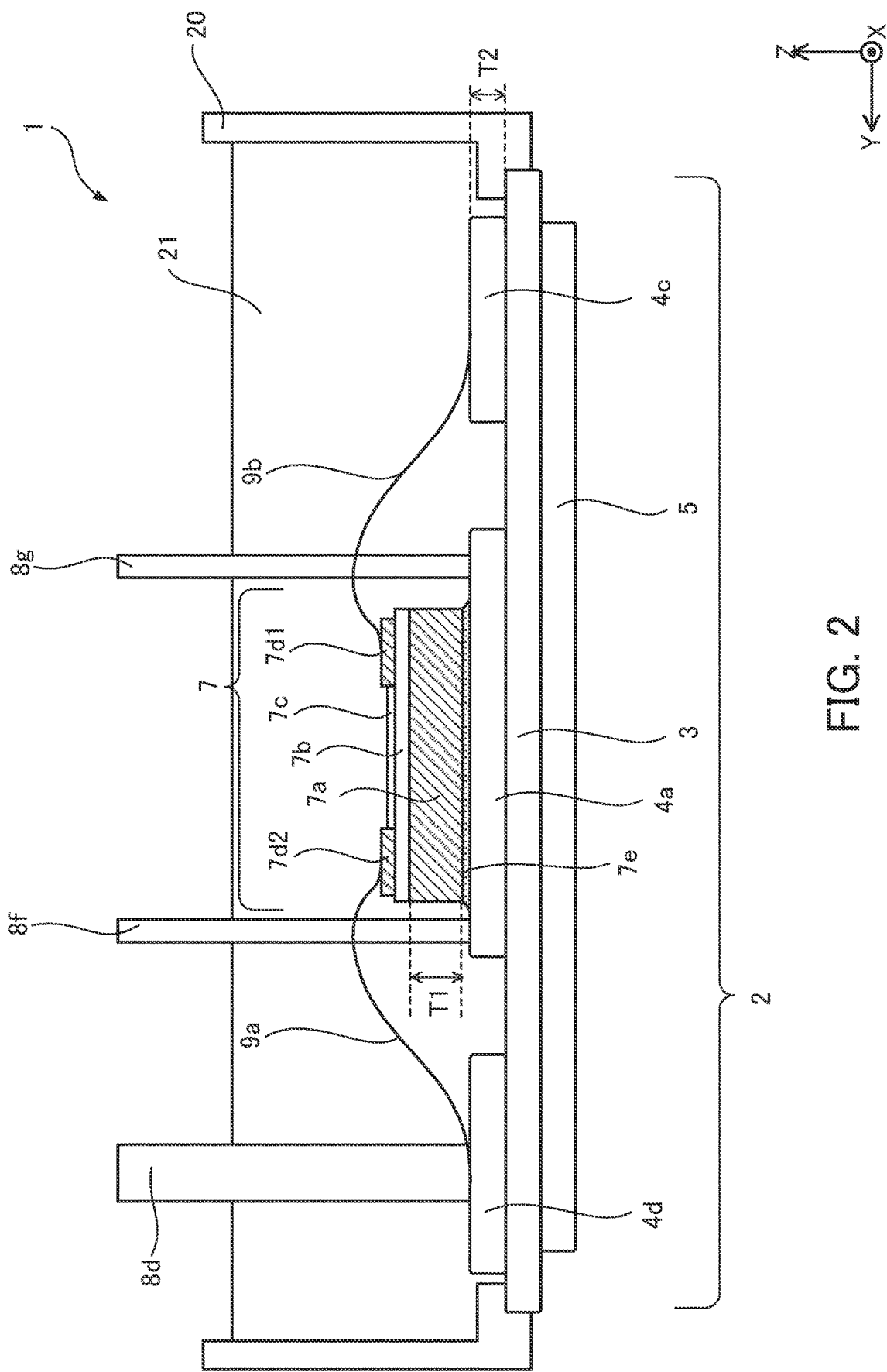
FIG. 2 is a sectional view of the semiconductor device according to the first embodiment.

A semiconductor device according to a first embodiment will be described by the use of FIG. 1 and FIG. 2. FIG. 1 is a plan view of a semiconductor device according to the first embodiment. FIG. 2 is a sectional view of the semiconductor device according to the first embodiment. FIG. 2 is a sectional view taken along the dot-dash line X-X of FIG. 1.

A semiconductor device 1 includes an insulated circuit board 2, a semiconductor chip 6 and a resistance element 7 mounted over the insulated circuit board 2, and main current terminals 8*d* and 8*e* and current sense terminals 8*f* and 8*g* mounted over the insulated circuit board 2. With the semiconductor device 1, these are housed in a case 20 and the inside of the case 20 is sealed with a sealing member 21.

The insulated circuit board 2 is rectangular in plan view. The insulated circuit board 2 includes an insulating plate 3, a plurality of circuit patterns 4*a* through 4*h* formed over the front surface of the insulating plate 3, and a metal plate 5 formed on the back surface of the insulating plate 3. The insulating plate 3 and the metal plate 5 are rectangular in plan view. Furthermore, corner portions of the insulating plate 3 and the metal plate 5 may be R-chamfered or C-chamfered. The metal plate 5 is smaller in size than the insulating plate 3 in plan view and is formed inside the insulating plate 3. The insulating plate 3 has an insulating property and is made of a ceramic having high thermal conductivity. Such a ceramic is made of a material which contains as a main component aluminum oxide, aluminum nitride, silicon nitride, or the like. In addition, the thickness of the insulating plate 3 is greater than or equal to 0.5 mm and smaller than or equal to 2.0 mm.

The circuit patterns 4*a* through 4*h* are made of metal having good electrical conductivity. For example, such metal is silver, copper, nickel, or an alloy containing at least one of them. In this embodiment the circuit patterns 4*a* through 4*h* are made of metal which contains as a main component copper or a copper alloy. Furthermore, the thickness T2 of the circuit patterns 4*a* through 4*h* is greater than or equal to 0.2 mm and smaller than or equal to 1.5 mm. In this embodiment the thickness T2 of the circuit patterns 4*a* through 4*h* is 0.3 mm. In order to improve corrosion resistance, plating treatment may be performed on the surfaces of the circuit patterns 4*a* through 4*h*. At this time nickel, a nickel-phosphorus alloy, a nickel-boron alloy or the like is used as a plating material. The circuit patterns 4*a* through 4*h* are formed over the insulating plate 3 in the following way. A metal layer is formed over the front surface of the insulating plate 3 and etching, cutting, laser processing, or the like is performed on the metal layer. By doing so, the circuit patterns 4*a* through 4*h* are obtained. Alternatively, the circuit patterns 4*a* through 4*h* cut in advance out of a metal layer may be pressure-bonded to the front surface of the insulating plate 3. In addition, corner portions of each of the circuit patterns 4*a* through 4*h* are R-chamfered. The circuit patterns 4*a* through 4*h* illustrated in FIG. 1 and FIG. 2 are taken as an example. The quantity, shape, size, and the like of the circuit patterns 4*a* through 4*h* may be properly selected at need. When no distinction is made between the circuit patterns 4*a* through 4*h*, then the circuit patterns 4*a* through 4*h* may be referred to as the circuit patterns 4.

The metal plate 5 is made of metal, such as aluminum, iron, silver, copper, or an alloy containing at least one of them, having high thermal conductivity. Furthermore, corner portions of the metal plate 5 may be R-chamfered. The thickness of the metal plate 5 is greater than or equal to 0.2 mm and smaller than or equal to 0.4 mm. In order to improve corrosion resistance, plating treatment may be performed on the surface of the metal plate 5. At this time nickel, a nickel-phosphorus alloy, a nickel-boron alloy, or the like is used as a plating material.

A direct copper bonding (DCB) substrate, an active metal brazed (AMB) substrate, or the like may be used as the above insulated circuit board 2. Furthermore, a thermally conductive member is located on the back surface of the metal plate 5 of the insulated circuit board 2 of the semiconductor device 1. A radiation unit (not illustrated) is fixed on the back surface of the metal plate 5 with the thermally conductive member therebetween. This improves the heat dissipation property of the semiconductor device 1 further. The thermally conductive member is a thermal interface material (TIM). A TIM is a generic name for various thermally conductive materials such as a grease, an elastomer sheet, room temperature vulcanization (RTV) rubber, gel, or a phase change material.

The semiconductor chip 6 is a switching element or a diode element made of silicon or silicon carbide. The semiconductor chip 6 has the shape of a flat plate and is rectangular in plan view. If the semiconductor chip 6 is a switching element, then the semiconductor chip 6 is an IGBT, a power MOSFET, or the like. If the semiconductor chip 6 is an IGBT, then the semiconductor chip 6 has a collector electrode, which is rectangular in plan view, as a main electrode on the back surface and has a gate electrode, which is rectangular in plan view, on a central portion of one end portion of the front surface and an emitter electrode as a main electrode on an area except the gate electrode of the front surface. If the semiconductor chip 6 is a power MOSFET, then the semiconductor chip 6 has a drain electrode, which is rectangular in plan view, as a main electrode on the back surface and has a gate electrode, which is rectangular in plan view, on a central portion of one end portion of the front surface and a source electrode as a main electrode on an area except the gate electrode of the front surface.

Furthermore, if the semiconductor chip 6 is a diode element, then the semiconductor chip 6 is a free wheeling diode (FWD) such as a Schottky barrier diode (SBD) or a P-intrinsic-N (PiN) diode. In this case, the semiconductor chip 6 has a cathode electrode, which is rectangular in plan view, as a main electrode on the back surface and has an anode electrode, which is rectangular in plan view, as a main electrode on the front surface.

The resistance element 7 is a shunt resistor. The resistance element 7 is rectangular in plan view and the length of its one side is greater than or equal to 9.0 mm and smaller than or equal to 12 mm. Furthermore, the height (length from the back surface to the front surface in side view) of the resistance element 7 is greater than or equal to 0.5 mm and smaller than or equal to 0.7 mm. The resistance element 7 is bonded to a bonding area 4a1 on the front surface of the circuit pattern 4a. The outer periphery of the bonding area 4a1 may correspond to the outer periphery of the back surface of the resistance element 7 (metal block 7a described later). That is to say, the bonding area 4a1 is rectangular in plan view and may be equal in area to the resistance element 7. There is need for the front surface of the circuit pattern 4a to be larger in plan view than the bonding area 4a1. The external shape of the circuit pattern 4a may be a rectangle in plan view which is a size larger than the bonding area 4a1. The resistance element 7 includes the metal block 7a, a resin layer 7b, a resistance film 7c, main current electrodes 7d1 and 7d2, and measurement electrodes 7d3 and 7d4.

The metal block 7a has the shape of a cube (shape of a block). The front surface and back surface of the metal block 7a are equal in external shape and area. The metal block 7a is rectangular in plan view and the length of its one side is greater than or equal to 9.0 mm and smaller than or equal to 12 mm. Furthermore, the thickness T1 of the metal block 7a is greater than or equal to 0.3 mm and smaller than or equal to 1.0 mm. In this embodiment the thickness T1 of the metal block 7a is 0.5 mm. That is to say, it is preferable that the thickness T1 of the metal block 7a be greater than or equal to 1.2 times the thickness T2 of the circuit pattern 4a and smaller than or equal to 5.0 times the thickness T2 of the circuit pattern 4a. It is more preferable that the thickness T1 of the metal block 7a be greater than or equal to 1.5 times the thickness T2 of the circuit pattern 4a and smaller than or equal to 3.0 times the thickness T2 of the circuit pattern 4a.

Furthermore, as stated above, the back surface of the metal block 7a (resistance element 7) is bonded to the bonding area 4a1 of the circuit pattern 4a. At this time an outer peripheral portion of the circuit pattern 4a may extend outside an outer peripheral portion of the bonding area 4a1 by the thickness (0.5 mm) of the metal block 7a or more. In addition, it is preferable that the outer peripheral portion of the circuit pattern 4a extend outside the outer peripheral portion of the bonding area 4a1 by 2 times (1.0 mm) the thickness of the metal block 7a or more.

The metal block 7a is made of metal, such as silver, copper, nickel, or an alloy containing at least one of them, having good electrical conductivity. In this case, the metal block 7a is made of metal which contains as a main component copper or a copper alloy. In order to improve corrosion resistance, plating treatment may be performed on the surface of the metal block 7a. At this time nickel, a nickel-phosphorus alloy, a nickel-boron alloy or the like is used as a plating material.

The resin layer 7b is formed over the whole of the front surface of the metal block 7a. The resin layer 7b is made of resin, such as epoxy resin, phenolic resin, silicone resin, or polyimide resin, having an insulating property and a heat resistance property. The thickness of the resin layer 7b is greater than or equal to 0.1 mm and smaller than or equal to 0.15 mm.

The resistance film 7c is formed in plan view over a central portion of the front surface of the resin layer 7b. One side of the resistance film 7c is situated on one edge side of the resin layer 7b. A recess is formed on another side opposite the one side of the resistance film 7c. That is to say, projections are formed on both ends of the other side of the resistance film 7c. Furthermore, the resistance film 7c is a metal thin film which contains as a main component silver, copper, nickel, gold, an alloy containing at least one of them, or the like. The resistance film 7c, which is such a metal thin film, is formed over the resin layer 7b by evaporation, sputtering, plasma chemical vapor deposition (CVD), or the like. The thickness of the resistance film 7c is greater than or equal to 0.05 mm and smaller than or equal to 0.07 mm.

The main current electrodes 7d1 and 7d2 and the measurement electrodes 7d3 and 7d4 are made of metal having good electrical conductivity. Such a metal contains as a main component silver, copper, nickel, an alloy containing at least one of them, or the like. In this case, the main current electrodes 7d1 and 7d2 and the measurement electrodes 7d3 and 7d4 are made of metal which contains as a main component copper or a copper alloy. In order to improve corrosion resistance, plating treatment may be performed on the surfaces of the main current electrodes 7d1 and 7d2 and the measurement electrodes 7d3 and 7d4. At this time nickel, a nickel-phosphorus alloy, a nickel-boron alloy or the like is used as a plating material.

Furthermore, each of the main current electrodes 7d1 and 7d2 is formed so as to be a rectangular pattern. Each of the main current electrodes 7d1 and 7d2 is formed on a side portion of the resistance film 7c over the front surface of the resin layer 7b. At this time the main current electrodes 7d1 and 7d2 are in contact with the side portions of the resistance film 7c. That is to say, the main current electrodes 7d1 and 7d2 are situated over an outer peripheral portion of the resin layer 7b.

Each of the measurement electrodes 7d3 and 7d4 is formed so as to be a rectangular pattern. The measurement electrodes 7d3 and 7d4 are parallel to the main current electrodes 7d1 and 7d2 respectively and are formed on the opposite sides of the main current electrodes 7d1 and 7d2, respectively, with respect to the resistance film 7c over the front surface of the resin layer 7b. At this time the measurement electrodes 7d3 and 7d4 are in contact with the two projections, respectively, of the resistance film 7c. That is to say, the measurement electrodes 7d3 and 7d4 are also situated over the outer peripheral portion of the resin layer 7b.

Furthermore, the back surfaces of the semiconductor chip 6 and the resistance element 7 are bonded to the circuit patterns 4b and 4a, respectively, with a bonding member 7e (FIG. 2). A sintered metal body or solder is used as the bonding member 7e. Metal microparticle powder used for the sintered metal body contains as a main component silver, copper, an alloy containing at least one of them, or the like. In addition, for example, Pb-free solder is used as the solder. The Pb-free solder contains as a main component at least one of a tin-silver-copper alloy, a tin-zinc-bismuth alloy, a tin-copper alloy, and a tin-silver-indium-bismuth alloy, and the like. Moreover, the solder may contain an additive such as nickel, germanium, cobalt, or silicon. The solder containing an additive improves wettability, a gloss, and bonding strength and reliability is improved. In this embodiment a case where the bonding member 7e is solder is taken as an example. The thickness of the bonding member 7e used for bonding the resistance element 7 and the circuit pattern 4a together is greater than or equal to 0.05 mm and smaller than or equal to 0.20 mm. In this embodiment the thickness of the bonding member 7e is 0.10 mm.

The main current terminals 8d and 8e and the current sense terminals 8f and 8g are made of metal having good electrical conductivity. Such a metal contains as a main component silver, copper, nickel, an alloy containing at least one of them, or the like. In this case, the main current terminals 8d and 8e and the current sense terminals 8f and 8g are made of metal which contains as a main component copper or a copper alloy. In order to improve corrosion resistance, plating treatment may be performed on the surfaces of the main current terminals 8d and 8e and the current sense terminals 8f and 8g. At this time nickel, a nickel-phosphorus alloy, a nickel-boron alloy or the like is used as a plating material. Furthermore, the main current terminals 8d and 8e and the current sense terminals 8f and 8g may have the shape of a pole. The main current terminals 8d and 8e and the current sense terminals 8f and 8g are bonded to the circuit patterns 4d, 4e, 4f, and 4g, respectively, with the above bonding member. In addition, the main current terminals 8d and 8e and the current sense terminals 8f and 8g may be bonded directly to the circuit patterns 4d, 4e, 4f, and 4g, respectively, by the use of ultrasonic waves or laser beams.

Bonding wires 9a and 9b connect the main current electrodes 7d1 and 7d2 of the resistance element 7 and the circuit patterns 4d and 4c, respectively, electrically and mechanically. Bonding wires 9e and 9f connect the measurement electrodes 7d3 and 7d4 of the resistance element and the circuit patterns 4f and 4g, respectively, electrically and mechanically. Furthermore, a bonding wire 9c connects the circuit patterns 4e and 4b electrically and mechanically. A bonding wire 9d connects the main electrode on the front surface of the semiconductor chip 6 and the circuit pattern 4c electrically and mechanically. A bonding wire 9g connects the control electrode of the semiconductor chip 6 and the circuit pattern 4h electrically and mechanically. The bonding wires 9a through 9g are made of a material having good electrical conductivity. Such a material contains as a main component gold, silver, copper, aluminum, an alloy containing at least one of them, or the like. In addition, for example, the diameter of the bonding wires 9e through 9g is greater than or equal to 110 μm and smaller than or equal to 200 μm. For example, the diameter of the bonding wires 9a through 9d is greater than or equal to 350 μm and smaller than or equal to 500 μm.

The case 20 houses the circuit patterns 4 on the front surface of the insulated circuit board 2, the semiconductor chip 6, the resistance element 7, one end portions of the main current terminals 8d and 8e and the current sense terminals 8f and 8g, and the bonding wires 9a through 9g. The other end portions of the main current terminals 8d and 8e and the current sense terminals 8f and 8g may extend upward (in the +Z direction) from the front surface of the case 20. The case 20 is made of resin. Such resin contains as a main component a thermoplastic resin such as polyphenylene sulfide resin, polybutylene terephthalate resin, polybutylene succinate resin, polyamide resin, or acrylonitrile butadiene styrene resin.

The sealing member 21 may seal the inside of the case 20. That is to say, the sealing member 21 seals the circuit patterns 4 on the front surface of the insulated circuit board 2, the semiconductor chip 6, the resistance element 7, the one end portions of the main current terminals 8d and 8e and the current sense terminals 8f and 8g, and the bonding wires 9a through 9g. For example, the sealing member contains a thermosetting resin and a filling material contained in a thermosetting resin. A thermosetting resin is epoxy resin, phenolic resin, maleimide resin, or the like. An example of the sealing member 21 is epoxy resin containing a filling material. An inorganic material, such as silicon oxide, aluminum oxide, boron nitride, or aluminum nitride, is used as the filling material. Silicone gel may be used as the sealing member 21 in place of the above materials.

With the semiconductor device 1 the main electrode on the back surface of the semiconductor chip 6 is electrically connected via the circuit pattern 4e, the bonding wire 9c, and the circuit pattern 4b to the main current terminal 8e which is a P terminal. Furthermore, the main electrode on the front surface of the semiconductor chip is electrically connected via the bonding wire 9d, the circuit pattern 4c, the bonding wire 9b, the resistance element 7, the bonding wire 9a, and the circuit pattern 4d to the main current terminal 8d which is an N terminal. The control electrode of the semiconductor chip 6 is electrically connected via the bonding wire 9g and the circuit pattern 4h to a control terminal 8h. Accordingly, when a control signal is inputted to the control terminal 8h of the semiconductor device 1 at determined timing, a current is outputted from the main electrode on the front surface of the semiconductor chip 6 according to the control signal. The current outputted from the semiconductor chip 6 is inputted to the main current electrode 7d2 of the resistance element 7, flows through the resistance film 7c, and is outputted from the main current electrode 7d1. At this time the current flowing through the resistance film 7c is outputted via the measurement electrodes 7d4 and 7d3, the bonding wires 9f and 9e, and the circuit patterns 4g and 4f from the current sense terminals 8g and 8f. A potential is measured on the basis of this current.

When the current outputted from the semiconductor chip 6 flows through the resistance film 7c of the resistance element 7, the resistance film 7c generates heat. In this case, the metal block 7a included in the resistance element 7 is sufficiently thicker than the circuit patterns 4. Accordingly, the resistance element 7 properly conducts the heat generated by the resistance film 7c from the metal block 7a to the circuit pattern 4a and dissipates the heat via the circuit pattern 4a, the insulating plate 3, and the metal plate 5 to the outside.

The above semiconductor device 1 has the resistance element 7 including the metal block 7a, the resin layer 7b formed over the metal block 7a, and the resistance film 7c formed over the resin layer 7b and the insulated circuit board 2 including the insulating plate 3 and the circuit pattern 4a formed over the insulating plate 3, having on the front surface the bonding area 4a1 to which the back surface of the metal block 7a of the resistance element 7 is bonded, and having area larger in plan view than that of the front surface of the resistance element 7. In this case, the metal block 7a is thicker than the circuit pattern 4a. As a result, the metal block 7a properly conducts heat generated by the resistance film 7c of the resistance element 7 to the circuit pattern 4a. This improves the heat dissipation property of the resistance element 7 and suppresses deterioration in the heat dissipation property of the insulated circuit board 2. Accordingly, deterioration in the reliability of the semiconductor device 1 is also suppressed.

Second Embodiment

Figure 3:
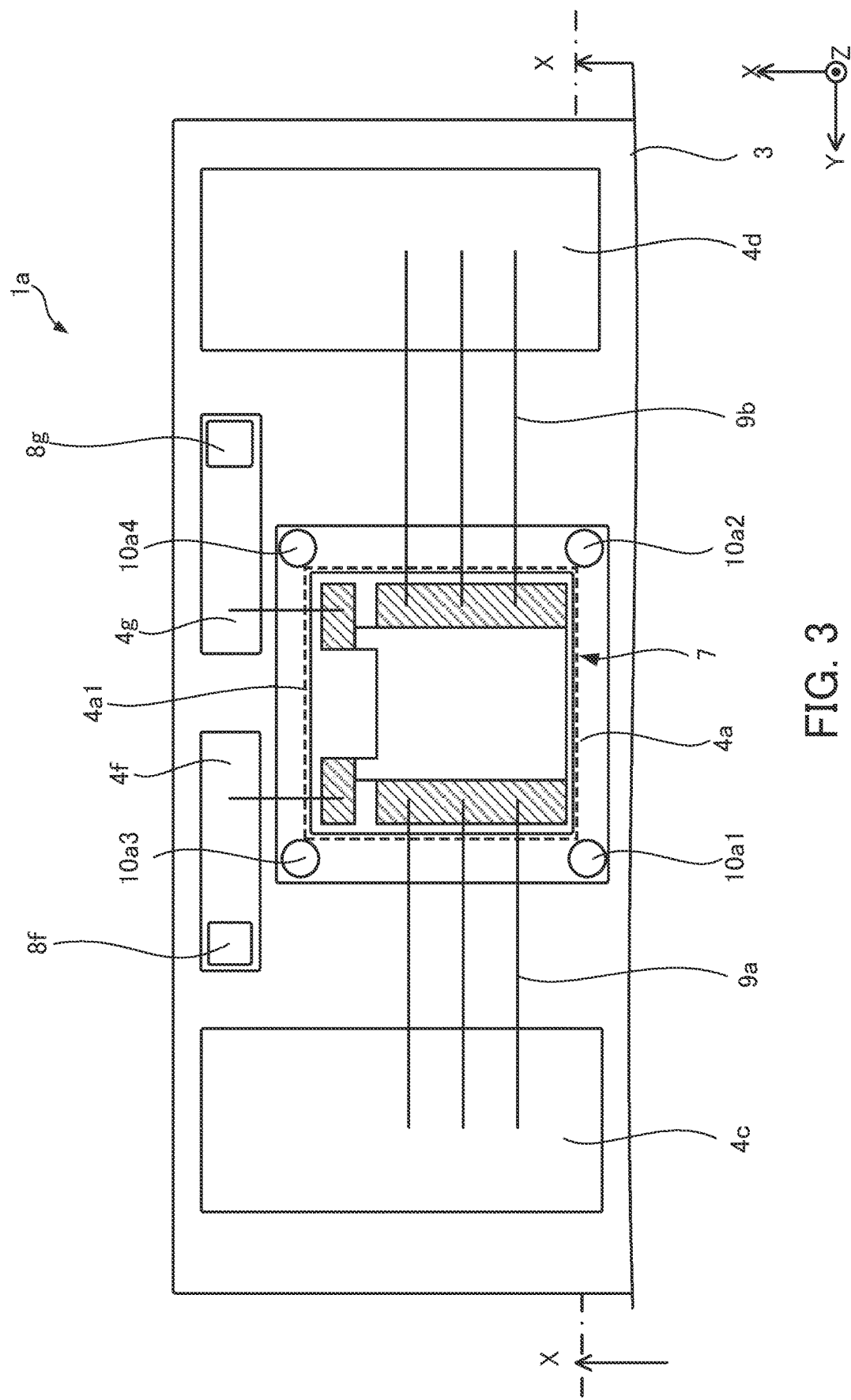
FIG. 3 is a fragmentary plan view of a semiconductor device according to a second embodiment.
Figure 4:
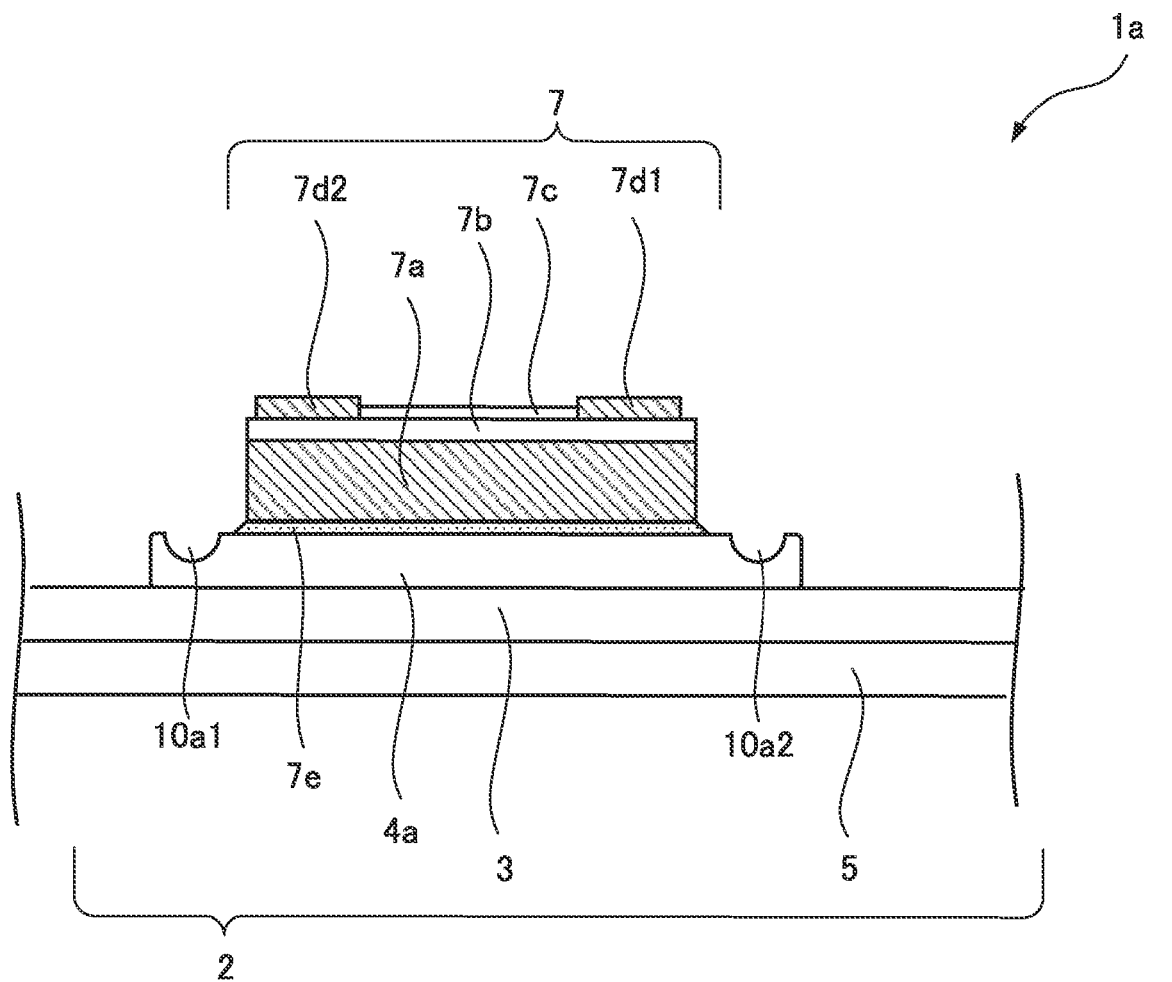
FIG. 4 is a fragmentary sectional view of the semiconductor device according to the second embodiment.

A semiconductor device according to a second embodiment will be described by the use of FIG. 3 and FIG. 4. FIG. 3 is a fragmentary plan view of a semiconductor device according to a second embodiment. FIG. 4 is a fragmentary sectional view of the semiconductor device according to the second embodiment. FIG. 3 is an enlarged plan view of the vicinities of a resistance element 7 of a semiconductor device 1a. FIG. 4 is an enlarged sectional view of the vicinities of the resistance element 7 taken along the dot-dash line X-X of FIG. 3. In the second embodiment a change made in the semiconductor device 1 according to the first embodiment will mainly be described. Furthermore, components of the semiconductor device 1a which are the same as those included in the semiconductor device 1 according to the first embodiment are marked with the same numerals and descriptions of them will be omitted or simplified.

With the semiconductor device 1a according to the second embodiment a concave portion (concavity) is formed in at least one of areas corresponding to four corners of the bonding area 4a1 of the circuit pattern 4a over which the resistance element 7 of the semiconductor device 1 according to the first embodiment is arranged. The areas corresponding to the four corners of the bonding area 4a1 mean areas outside and near corner portions of the bonding area 4a1. FIGS. 3 and 4 illustrate as a desirable case a case where concave portions 10a1 through 10a4 are formed in areas corresponding to all of the four corners of the bonding area 4a1. The concave portions 10a1 through 10a4 may be circular, elliptic, or rectangular in plan view. Furthermore, the diameter of the concave portions 10a1 through 10a4 is set so that the strength of a circuit pattern 4a will not fall. The diameter of the concave portions 10a1 through 10a4 is greater than or equal to 50 percent of a gap between an outer peripheral portion of the circuit pattern 4a and an outer peripheral portion of the bonding area 4a1 (resistance element 7) and smaller than or equal to 85 percent of the gap. The depth of the concave portions 10a1 through 10a4 is set so that they will not pierce the circuit pattern 4a. The depth of the concave portions 10a1 through 10a4 is greater than or equal to 50 percent of the thickness T2 of the circuit pattern 4a and smaller than or equal to 70 percent of the thickness T2 of the circuit pattern 4a. In addition, the concave portions 10a1 through 10a4 are formed in the circuit pattern 4a by etching, cutting, laser processing, or the like.

With the semiconductor device 1 according to the first embodiment, as stated above, the metal block 7a is made thicker than the circuit pattern 4a. By doing so, the heat dissipation property of the resistance element 7 is improved. If the heat dissipation property of the resistance element 7 is improved, then the amount of heat conducted to the circuit pattern 4a increases. If temperature cycling is performed on the semiconductor device 1, then the temperature of the circuit pattern 4a changes according to a rise or fall in temperature. In particular, heat is conducted from the metal block 7a to the circuit pattern 4a. As a result, a temperature differential of the circuit pattern 4a becomes greater and the circuit pattern 4a expands and contracts more. Because there is a difference in thermal expansion coefficient between the circuit pattern 4a and the insulating plate 3, there is a case where the insulating plate 3 does not accommodate expansion and contraction of the circuit pattern 4a. Accordingly, great stress is applied to the insulating plate 3 under a corner portion of the circuit pattern 4a and a crack may appear. At this time a crack tends to appear from each corner portion of the back surface of the circuit pattern 4a to the inside of the insulating plate 3. In particular, if the gap between the outer peripheral portion of the circuit pattern 4a and the outer peripheral portion of the bonding area 4a1 is small, then damage to the insulating plate 3 occurs significantly. As the gap between the outer peripheral portion of the circuit pattern 4a and the outer peripheral portion of the bonding area 4a1 becomes larger, stress applied from each corner portion of the back surface of the circuit pattern 4a to the insulating plate 3 is relaxed.

Accordingly, the concave portions 10a1 through 10a4 are formed in plan view in the areas corresponding to the four corners of the bonding area 4a1 of the semiconductor device 1a according to the second embodiment. There is a gap between an outer peripheral portion of the circuit pattern 4a and an outer peripheral portion of the bonding area 4a1. For example, the concave portions 10a1 through 10a4 are formed in this gap outside the four corners of the bonding area 4a1. Furthermore, as illustrated in FIG. 3, the concave portions 10a1 through 10a4 may be formed in plan view outside the four corners of the bonding area 4a1 and inside the four corners of the circuit pattern 4a.

That is to say, the volume of the areas corresponding to the four corners of the bonding area 4a1 is small compared with that of the four corners of the circuit pattern 4a in the first embodiment. Accordingly, even if the circuit pattern 4a expands and contracts by performing temperature cycling on the semiconductor device 1a, the circuit pattern 4a is hardly pulled from the insulating plate 3 because of the small volume of the four corners of the circuit pattern 4a. Furthermore, the concave portions 10a1 through 10a4 are formed in the four corners of the circuit pattern 4a in which stress specially tends to concentrate. As a result, stress applied to the insulating plate 3 under the corner portions of the circuit pattern 4a is relaxed and the appearance of a crack is suppressed.

With the above semiconductor device 1a, heat generated by a resistance element 7 is dissipated and deterioration in the heat dissipation property of an insulated circuit board 2 is suppressed. Furthermore, stress applied to the insulating plate 3 under the corner portions of the circuit pattern 4a is relaxed and the appearance of a crack is suppressed. As a result, the occurrence of damage to the insulated circuit board 2 is prevented and deterioration in the heat dissipation property of the insulated circuit board 2 is also suppressed. Accordingly, deterioration in the reliability of the semiconductor device 1a is also suppressed.

Various forms of concave portions formed in the circuit pattern 4a will now be described as modifications.

(Modification 2-1)

Figure 5:
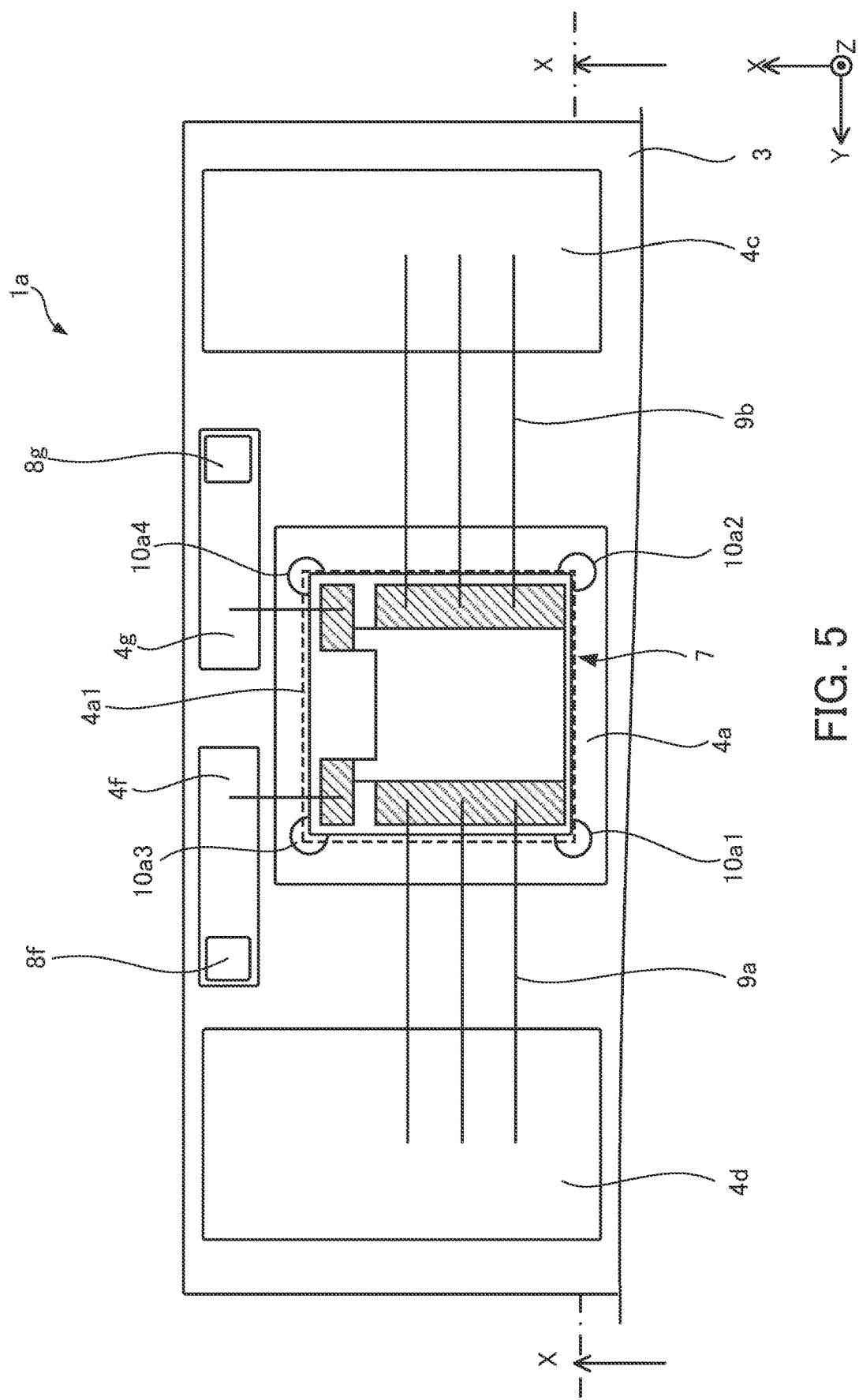
FIG. 5 is a fragmentary plan view of modification 2-1 of the semiconductor device according to the second embodiment.
Figure 6:
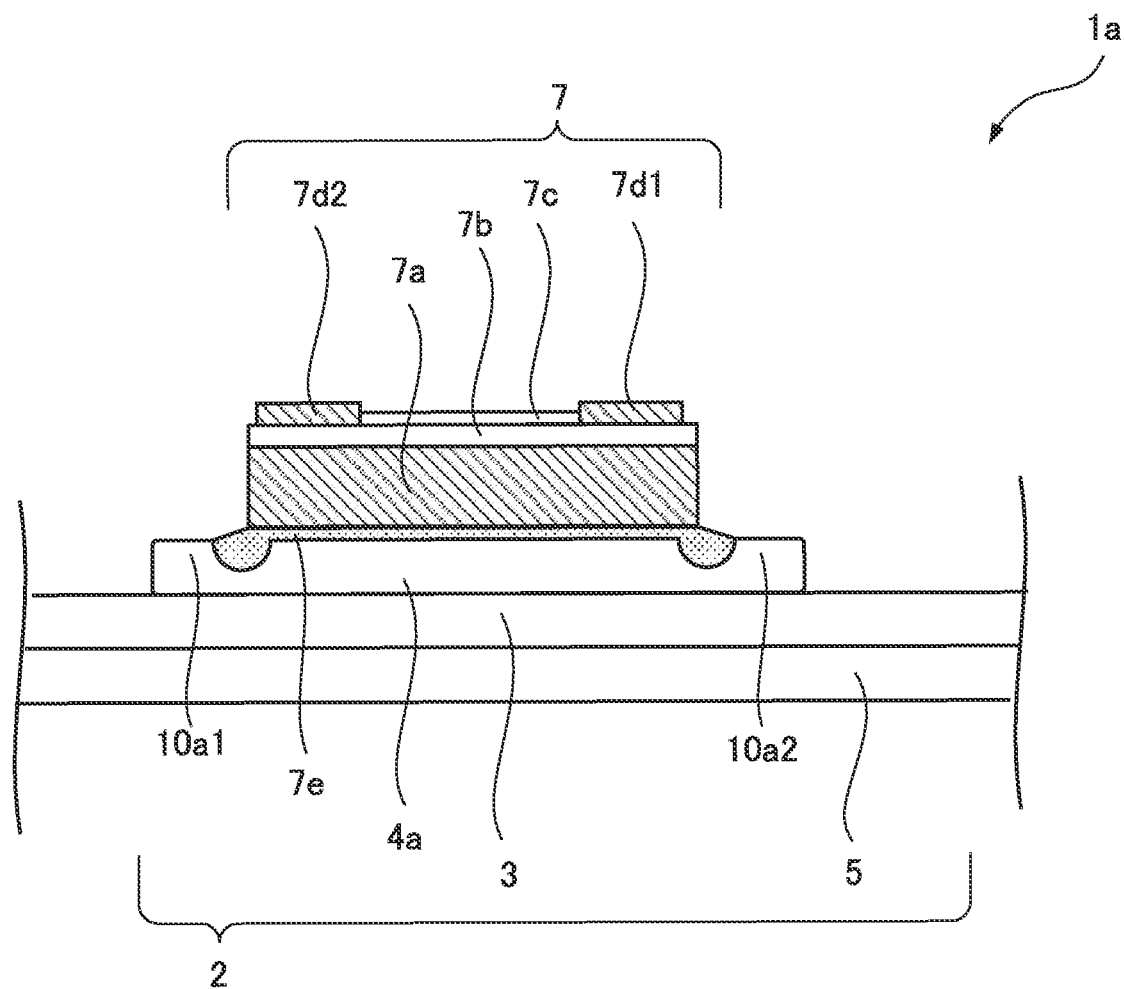
FIG. 6 is a fragmentary sectional view of modification 2-1 of the semiconductor device according to the second embodiment.

A semiconductor device 1a according to modification 2-1 will be described by the use of FIG. 5 and FIG. 6. FIG. 5 is a fragmentary plan view of modification 2-1 of the semiconductor device according to the second embodiment. FIG. 6 is a fragmentary sectional view of modification 2-1 of the semiconductor device according to the second embodiment. FIG. 5 is an enlarged plan view of the vicinities of a resistance element 7 of a semiconductor device 1a. FIG. 6 is an enlarged sectional view of the vicinities of the resistance element 7 taken along the dot-dash line X-X of FIG. 5. In modification 2-1 a change made in the semiconductor device 1a according to the second embodiment will mainly be described. Furthermore, components of the semiconductor device 1a according to modification 2-1 which are the same as those included in the semiconductor device 1 according to the first embodiment are marked with the same numerals and descriptions of them will be omitted or simplified.

With the semiconductor device 1a according to modification 2-1 concave portions 10a1 through 10a4 are formed so as to overlap four corners, respectively, of a bonding area 4a1 in plan view. For example, a concave portion is formed in a circuit pattern 4a so as to overlap at least one of the four corners of the bonding area 4a1 in plan view. FIGS. 5 and 6 illustrate as a desirable case a case where the concave portions 10a1 through 10a4 are formed under four corners, respectively, of the resistance element 7. As a result, stress applied by an outer peripheral portion of the resistance element 7 is relaxed. Furthermore, in this case, the concave portions 10a1 through 10a4 are also filled with a bonding member 7e which is solder.

With the semiconductor device 1a according to modification 2-1, heat generated by the resistance element 7 is dissipated and deterioration in the heat dissipation property of an insulated circuit board 2 is suppressed. Furthermore, stress applied to an insulating plate 3 under the corner portions of the circuit pattern 4a is relaxed and the appearance of a crack is suppressed. As a result, the occurrence of damage to the insulated circuit board 2 is prevented. In addition, the concave portions 10a1 through 10a4 are also filled with the bonding member 7e and wet-spreading of the bonding member 7e is prevented. This improves bonding strength between the resistance element 7 and the circuit pattern 4a. Accordingly, deterioration in the reliability of the semiconductor device 1a is also suppressed.

(Modification 2-2)

Figure 7:
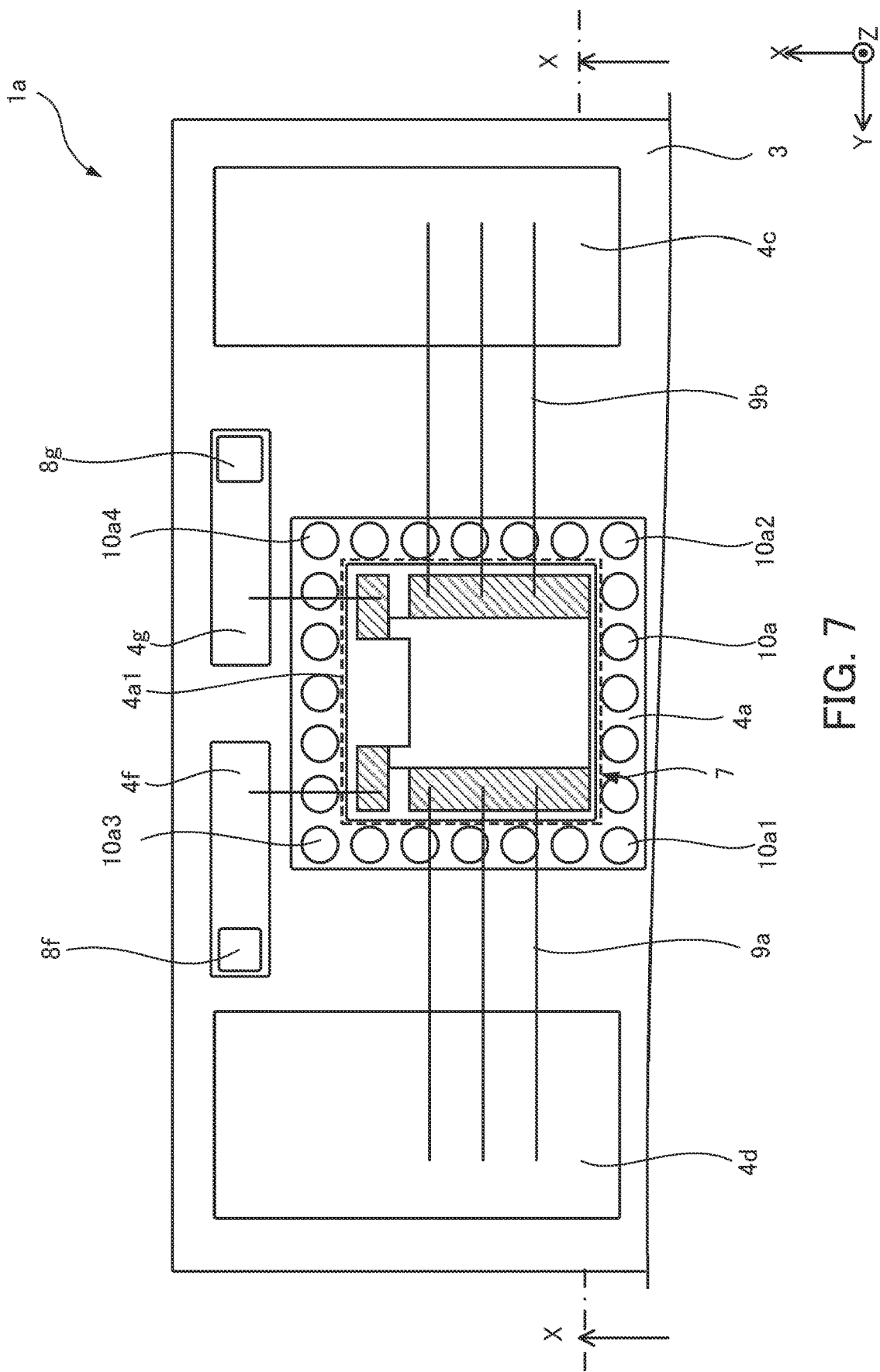
FIG. 7 is a fragmentary plan view of modification 2-2 of the semiconductor device according to the second embodiment.

A semiconductor device 1a according to modification 2-2 will be described by the use of FIG. 7. FIG. 7 is a fragmentary plan view of modification 2-2 of the semiconductor device according to the second embodiment. FIG. 7 is an enlarged plan view of the vicinities of a resistance element 7 of a semiconductor device 1a. Furthermore, FIG. 4 may be referred to for a sectional view of modification 2-2 taken along the dot-dash line X-X of FIG. 7. In modification 2-2 a change made in the semiconductor device 1a according to the second embodiment will also mainly be described. In addition, components of the semiconductor device 1a according to modification 2-2 which are the same as those included in the semiconductor device 1a according to the second embodiment are marked with the same numerals and descriptions of them will be omitted or simplified.

With the semiconductor device 1a according to modification 2-2 a plurality of concave portions 10a are formed between the concave portions 10a1 through 10a4 along each side of the circuit pattern 4a illustrated in FIG. 3. As described in FIG. 3 and FIG. 4, greater stress is applied to the insulating plate 3 under a corner portion of the circuit pattern 4a due to a change in temperature. Furthermore, at this time stress may also be applied to the insulating plate 3 under an outer peripheral portion of the resistance element 7.

Accordingly, with the semiconductor device 1a according to modification 2-2 concave portions 10a are formed along each side of a resistance element 7 in addition to concave portions 10a1 through 10a4 in the four corners of a circuit pattern 4a. As a result, stress applied to an insulating plate 3 is relaxed more reliably compared with the semiconductor device 1a illustrated in FIG. 3 and FIG. 4 and the appearance of a crack is suppressed more reliably.

In modification 2-2, as with modification 2-1, the concave portions 10a1 through 10a4 and the concave portions 10a may be formed in the circuit pattern 4a so as to overlap the outer peripheral portion of the resistance element 7 (bonding area 4a1) in plan view. By doing so, stress applied to the insulating plate 3 under the outer peripheral portion of the resistance element 7 is relaxed compared with the case of modification 2-1.

(Modification 2-3)

Figure 8:
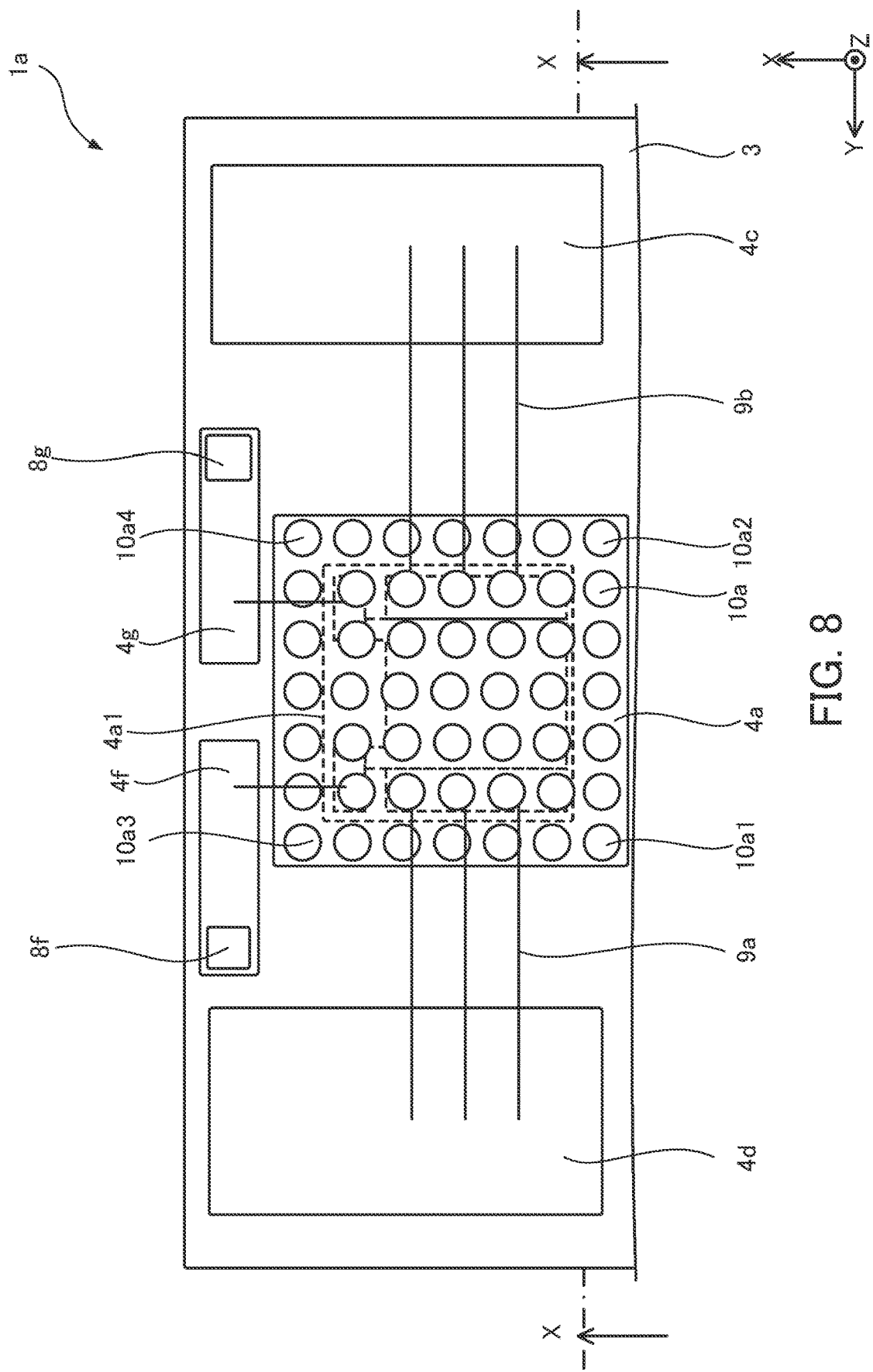
FIG. 8 is a fragmentary plan view of modification 2-3 of the semiconductor device according to the second embodiment.
Figure 9:
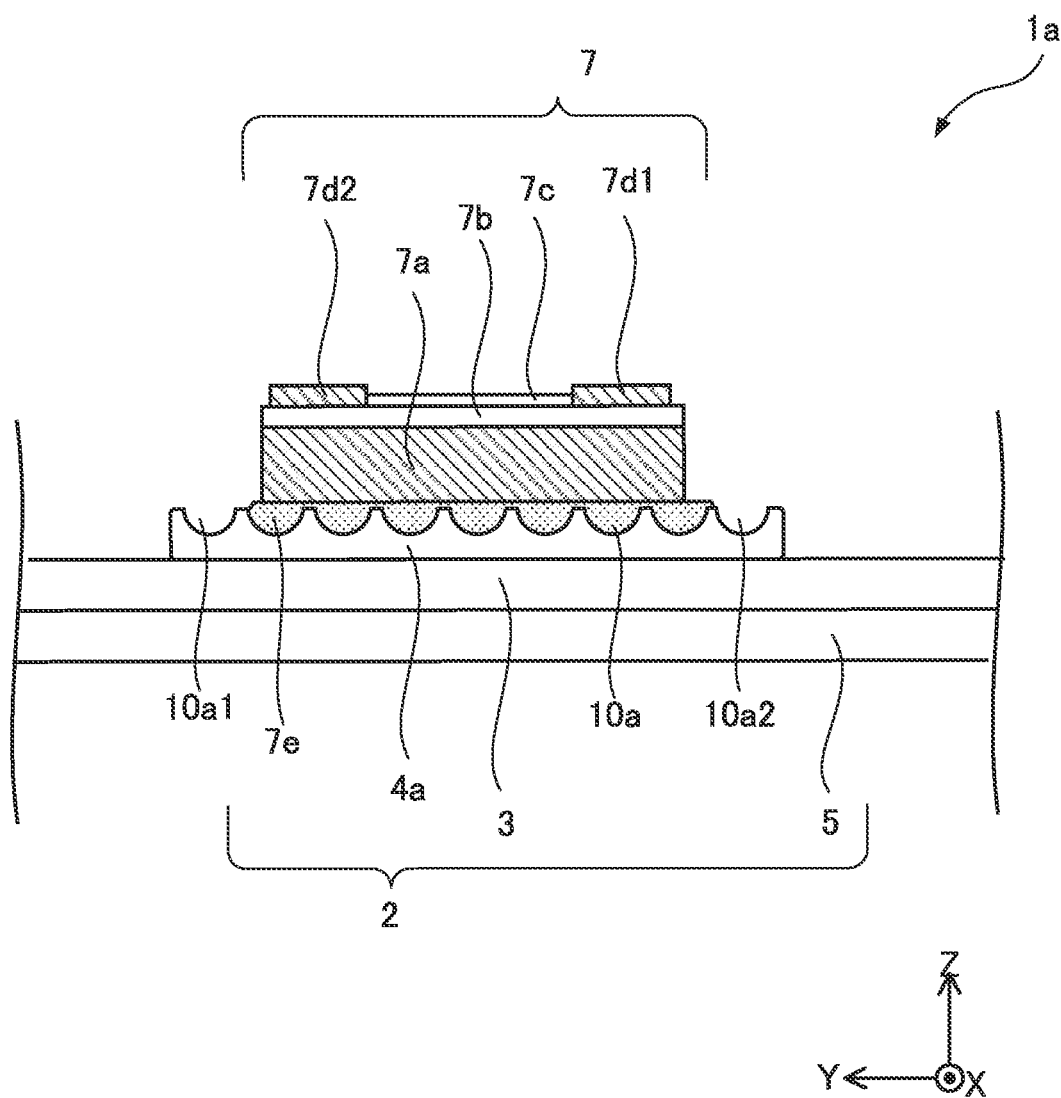
FIG. 9 is a fragmentary sectional view of modification 2-3 of the semiconductor device according to the second embodiment.

A semiconductor device 1a according to modification 2-3 will be described by the use of FIG. 8 and FIG. 9. FIG. 8 is a fragmentary plan view of modification 2-3 of the semiconductor device according to the second embodiment. FIG. 9 is a fragmentary sectional view of modification 2-3 of the semiconductor device according to the second embodiment. FIG. 8 is an enlarged plan view of the vicinities of a resistance element 7 of a semiconductor device 1a. Furthermore, in FIG. 8, the position of the resistance element 7 (bonding area 4a1) is indicated by a dashed line. FIG. 9 is an enlarged sectional view of the vicinities of the resistance element 7 taken along the dot-dash line X-X of FIG. 8. In modification 2-3 a change made in the semiconductor device 1a according to the second embodiment will mainly be described. Furthermore, components of the semiconductor device 1a according to modification 2-3 which are the same as those included in the semiconductor device 1a according to the second embodiment are marked with the same numerals and descriptions of them will be omitted or simplified.

With the semiconductor device 1a according to modification 2-3 a plurality of concave portions 10a are formed further in the bonding area 4a1 of the circuit pattern 4a of FIG. 7 over which the resistance element 7 is mounted. That is to say, in modification 2-3 the plurality of concave portions 10a are formed in the entire surface inside an outer peripheral portion of a circuit pattern 4a. Accordingly, concave portions 10a under the resistance element 7 (bonding area 4a1) are filled with a bonding member 7e. In modification 2-3, as with modification 2-1, concave portions 10a may be formed in the circuit pattern 4a so as to overlap the outer peripheral portion of the resistance element 7 (bonding area 4a1) in plan view. Furthermore, the total volume of the plurality of concave portions 10a formed in this way is greater than or equal to 0.8 times the volume of a metal block 7a and smaller than or equal to 1.2 times the volume of the metal block 7a. The total volume of the plurality of concave portions 10a formed in this way is preferably greater than or equal to 0.9 times the volume of the metal block 7a and smaller than or equal to 1.1 times the volume of the metal block 7a.

In the first embodiment, as stated above, the metal block 7a (resistance element 7) is mounted over the circuit pattern 4a. As a result, a crack may appear in the insulating plate 3 under a corner portion of the circuit pattern 4a. In modification 2-3 the total volume of the concave portions 10a formed in the circuit pattern 4a is made approximately equal to the volume of the metal block 7a. As a result, a state which is approximately the same as a state before mounting the metal block 7a is practically realized. Accordingly, expansion and contraction of the circuit pattern 4a are suppressed in temperature cycling, stress applied to an insulating plate 3 under a corner portion and an outer peripheral portion of the circuit pattern 4a is relaxed, and the appearance of a crack is suppressed. Furthermore, because expansion and contraction of the entire circuit pattern 4a are reduced, tin-based solder having small yield stress may be used as the bonding member 7e which is solder.

With the semiconductor device 1a according to modification 2-3, heat generated by the resistance element 7 is dissipated and deterioration in the heat dissipation property of an insulated circuit board 2 is suppressed. Furthermore, stress applied to the insulating plate 3 under a corner portion and the outer peripheral portion of the circuit pattern 4a is relaxed and the appearance of a crack is also suppressed. As a result, the occurrence of damage to the insulated circuit board 2 is prevented. In addition, the concave portions 10a are also filled with the bonding member 7e and wet-spreading of the bonding member 7e is prevented. This also improves bonding strength between the resistance element 7 and the circuit pattern 4a. Accordingly, deterioration in the reliability of the semiconductor device 1a is also suppressed.

(Modification 2-4)

Figure 10:
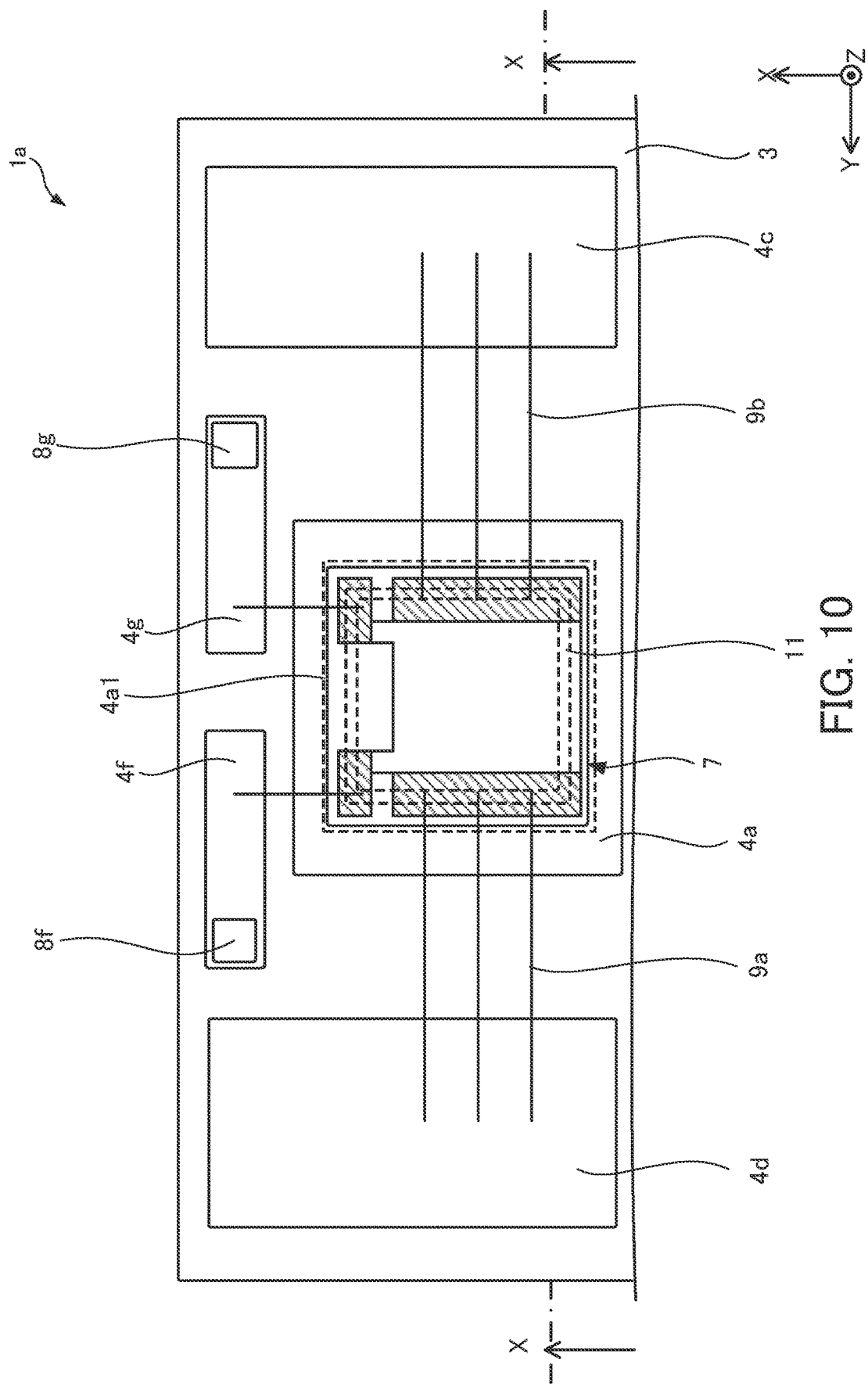
FIG. 10 is a fragmentary plan view of modification 2-4 of the semiconductor device according to the second embodiment.
Figure 11:
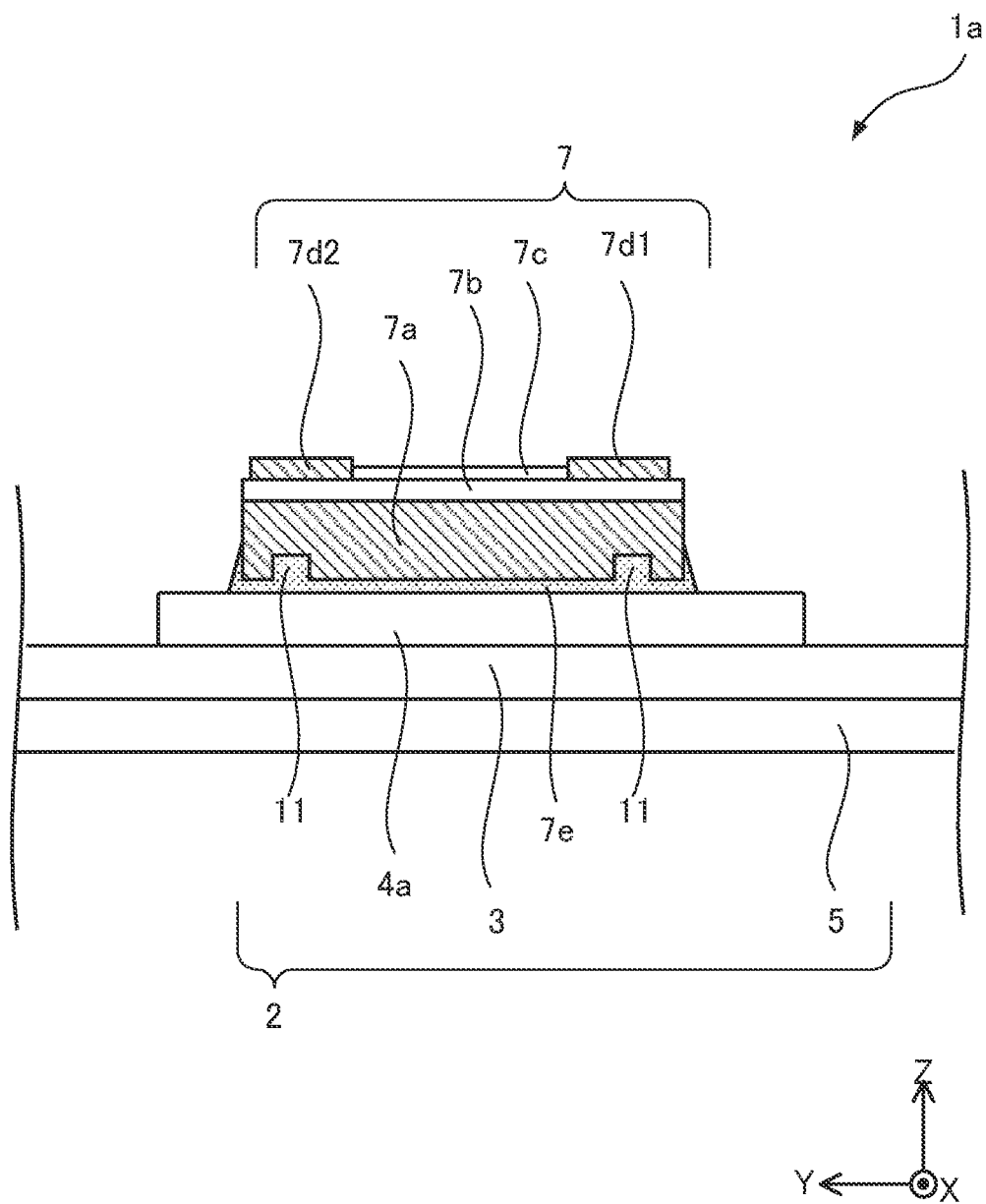
FIG. 11 is a fragmentary sectional view of modification 2-4 of the semiconductor device according to the second embodiment.

A semiconductor device 1a according to modification 2-4 will be described by the use of FIG. 10 and FIG. 11. FIG. 10 is a fragmentary plan view of modification 2-4 of the semiconductor device according to the second embodiment. FIG. 11 is a fragmentary sectional view of modification 2-4 of the semiconductor device according to the second embodiment. FIG. 10 is an enlarged plan view of the vicinities of a resistance element 7 of a semiconductor device 1a. FIG. 11 is an enlarged sectional view of the vicinities of the resistance element 7 taken along the dot-dash line X-X of FIG. 10. In modification 2-4 a change made in the semiconductor device 1 according to the first embodiment will mainly be described. Furthermore, components of the semiconductor device 1a according to modification 2-4 which are the same as those included in the semiconductor device 1 according to the first embodiment are marked with the same numerals and descriptions of them will be omitted or simplified.

With the semiconductor device 1a according to modification 2-4 a concave portion having the shape of a groove is formed in the back surface of the metal block 7a of the resistance element 7 of the semiconductor device 1 according to the first embodiment. FIGS. 10 and 11 illustrate as a desirable case a case where a concave portion 11 is formed in a continuous loop shape on the outer edge side along the four sides of a metal block 7a in the back surface of the metal block 7a. Furthermore, the concave portion 11 is formed just under main current electrodes 7d1 and 7d2 and measurement electrodes 7d3 and 7d4 inside the outer edge of the metal block 7a. Each corner portion of the concave portion 11 in the continuous loop shape may have an R-shape in plan view. The width of the concave portion 11 is greater than or equal to 10 percent of the length of each side of the metal block 7a and smaller than or equal to 30 percent of the length of each side of the metal block 7a. The concave portion 11 does not pierce the metal block 7a and the depth of the concave portion 11 is greater than or equal to 20 percent of the thickness T1 of the metal block 7a and smaller than or equal to 40 percent of the thickness T1 of the metal block 7a.

With the semiconductor device 1a according to modification 2-4 the concave portion 11 is formed in the back surface of the metal block 7a. By doing so, the volume of the metal block 7a is reduced. As a result, as with modification 2-3, a state which is approximately equal to a state before mounting the metal block 7a is realized. Accordingly, expansion and contraction of a circuit pattern 4a are suppressed in temperature cycling, stress applied to an insulating plate 3 under a corner portion and an outer peripheral portion of the circuit pattern 4a is relaxed, and the appearance of a crack is suppressed. Furthermore, the concave portion 11 is filled with a bonding member 7e which is solder. This improves bonding strength between the metal block 7a and the circuit pattern 4a.

With the semiconductor device 1a according to modification 2-4, heat generated by the resistance element 7 is dissipated and deterioration in the heat dissipation property of an insulated circuit board 2 is suppressed. Furthermore, stress applied to the insulating plate 3 under a corner portion and the outer peripheral portion of the circuit pattern 4a is relaxed and the appearance of a crack is also suppressed. As a result, the occurrence of damage to the insulated circuit board 2 is prevented. In addition, the concave portion 11 is also filled with the bonding member 7e and wet-spreading of the bonding member 7e is prevented. This also improves bonding strength between the resistance element 7 and the circuit pattern 4a. Accordingly, deterioration in the reliability of the semiconductor device 1a is also suppressed.

(Modification 2-5)

Figure 12:
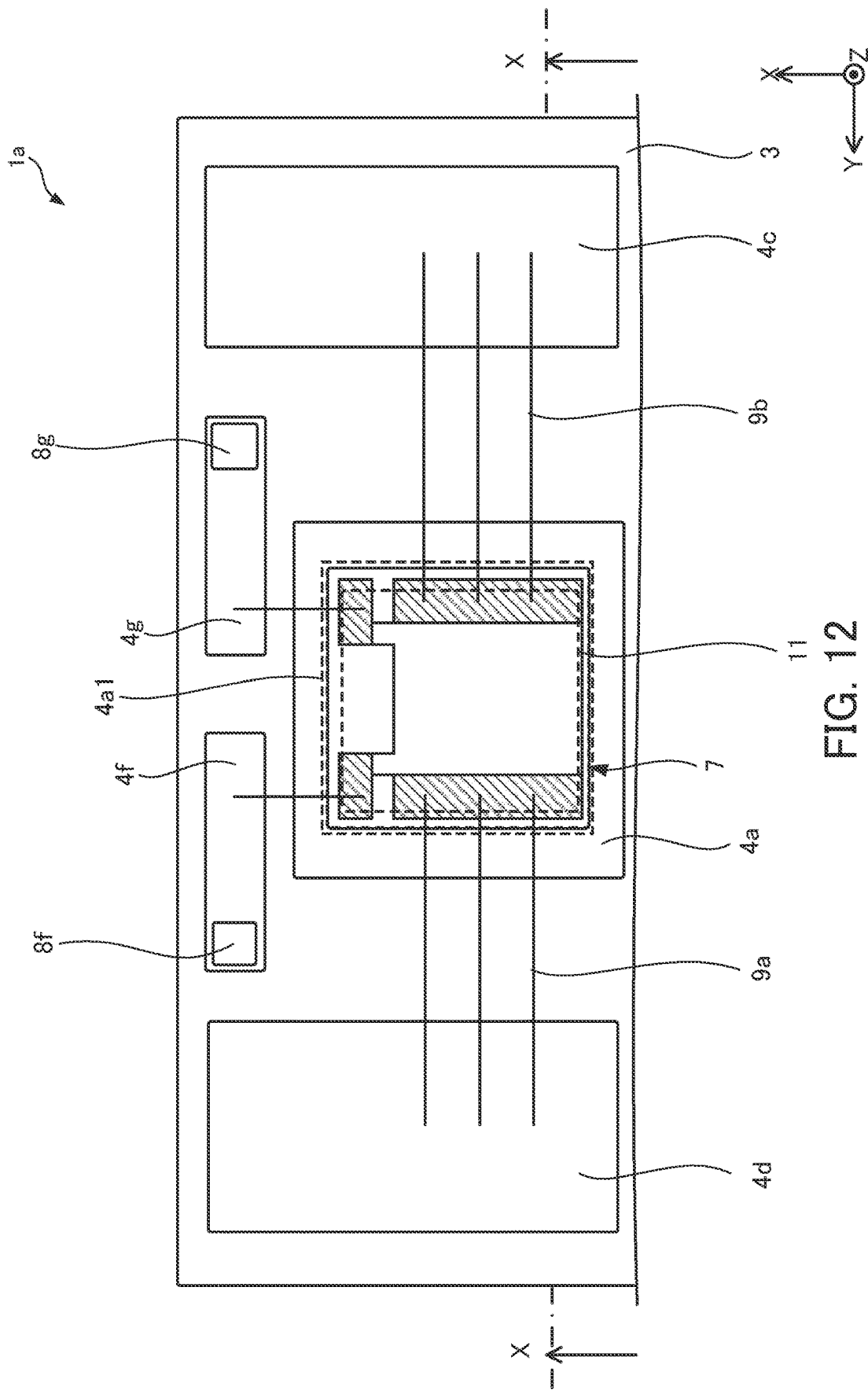
FIG. 12 is a fragmentary plan view of modification 2-5 of the semiconductor device according to the second embodiment.
Figure 13:
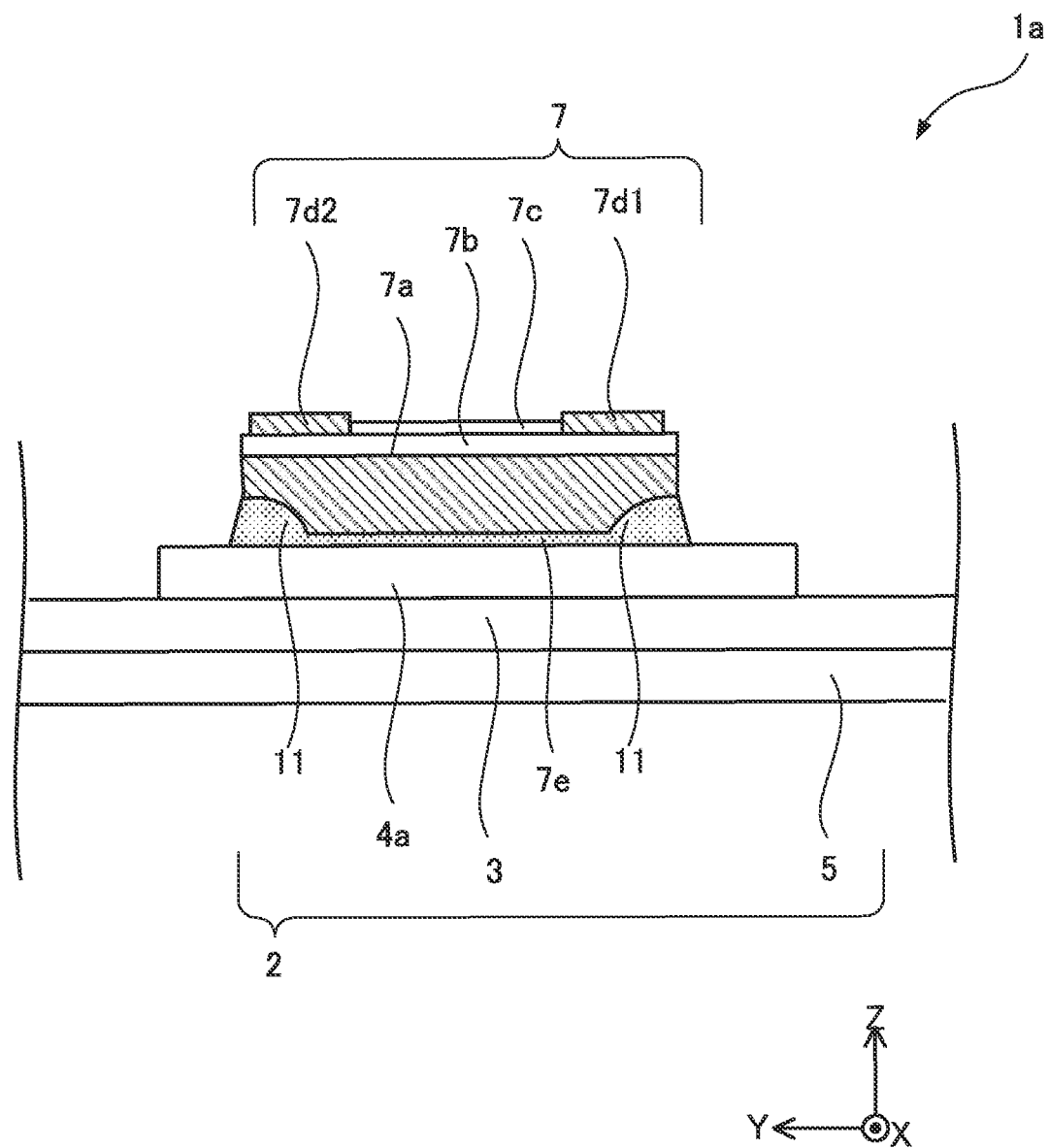
FIG. 13 is a fragmentary sectional view of modification 2-5 of the semiconductor device according to the second embodiment.

A semiconductor device 1a according to modification 2-5 will be described by the use of FIG. 12 and FIG. 13. FIG. 12 is a fragmentary plan view of modification 2-5 of the semiconductor device according to the second embodiment. FIG. 13 is a fragmentary sectional view of modification 2-5 of the semiconductor device according to the second embodiment. FIG. 12 is an enlarged plan view of the vicinities of a resistance element 7 of a semiconductor device 1a and the resistance element 7 outside the dashed line corresponds to a concave portion 11. FIG. 13 is an enlarged sectional view of the vicinities of the resistance element 7 taken along the dot-dash line X-X of FIG. 12. In modification 2-5 a change made in the semiconductor device 1 according to the first embodiment will mainly be described. Furthermore, components of the semiconductor device 1a according to modification 2-5 which are the same as those included in the semiconductor device 1 according to the first embodiment are marked with the same numerals and descriptions of them will be omitted or simplified.

With the semiconductor device 1a according to modification 2-5 the concave portion 11 is formed by making an outer peripheral portion and four corners of the back surface of a metal block 7a concave. Accordingly, the concave portion 11 of the metal block 7a facing a circuit pattern 4a is filled with a bonding member 7e and the metal block 7a is bonded to the circuit pattern 4a with the bonding member 7e.

With the semiconductor device 1a according to modification 2-5 the concave portion 11 is formed by making the outer peripheral portion and the four corners of the back surface of the metal block 7a concave. As a result, the distance between corner portions of the back surface of the metal block 7a and the circuit pattern 4a is increased. Accordingly, stress applied to an insulating plate 3 corresponding to the corner portions of the metal block 7a is relaxed and the appearance of a crack is suppressed. Furthermore, the concave portion 11 is filled with the bonding member 7e which is solder. This improves bonding strength between the metal block 7a and the circuit pattern 4a.

With the semiconductor device 1a according to modification 2-5, heat generated by the resistance element 7 is dissipated and deterioration in the heat dissipation property of an insulated circuit board 2 is suppressed. Furthermore, the distance between the corner portions of the back surface of the metal block 7a and the circuit pattern 4a is increased by forming the concave portion 11 obtained by making the outer peripheral portion and the corner portions of the back surface of the metal block 7a concave. Accordingly, stress applied to the insulating plate 3 under corner portions and an outer peripheral portion of the circuit pattern 4a is relaxed and the appearance of a crack is also suppressed. As a result, the occurrence of damage to the insulated circuit board 2 is prevented. In addition, the concave portion 11 is also filled with the bonding member 7e and wet-spreading of the bonding member 7e is prevented. This also improves bonding strength between the resistance element 7 and the circuit pattern 4a. Accordingly, deterioration in the reliability of the semiconductor device 1a is also suppressed.

Third Embodiment

Figure 14:
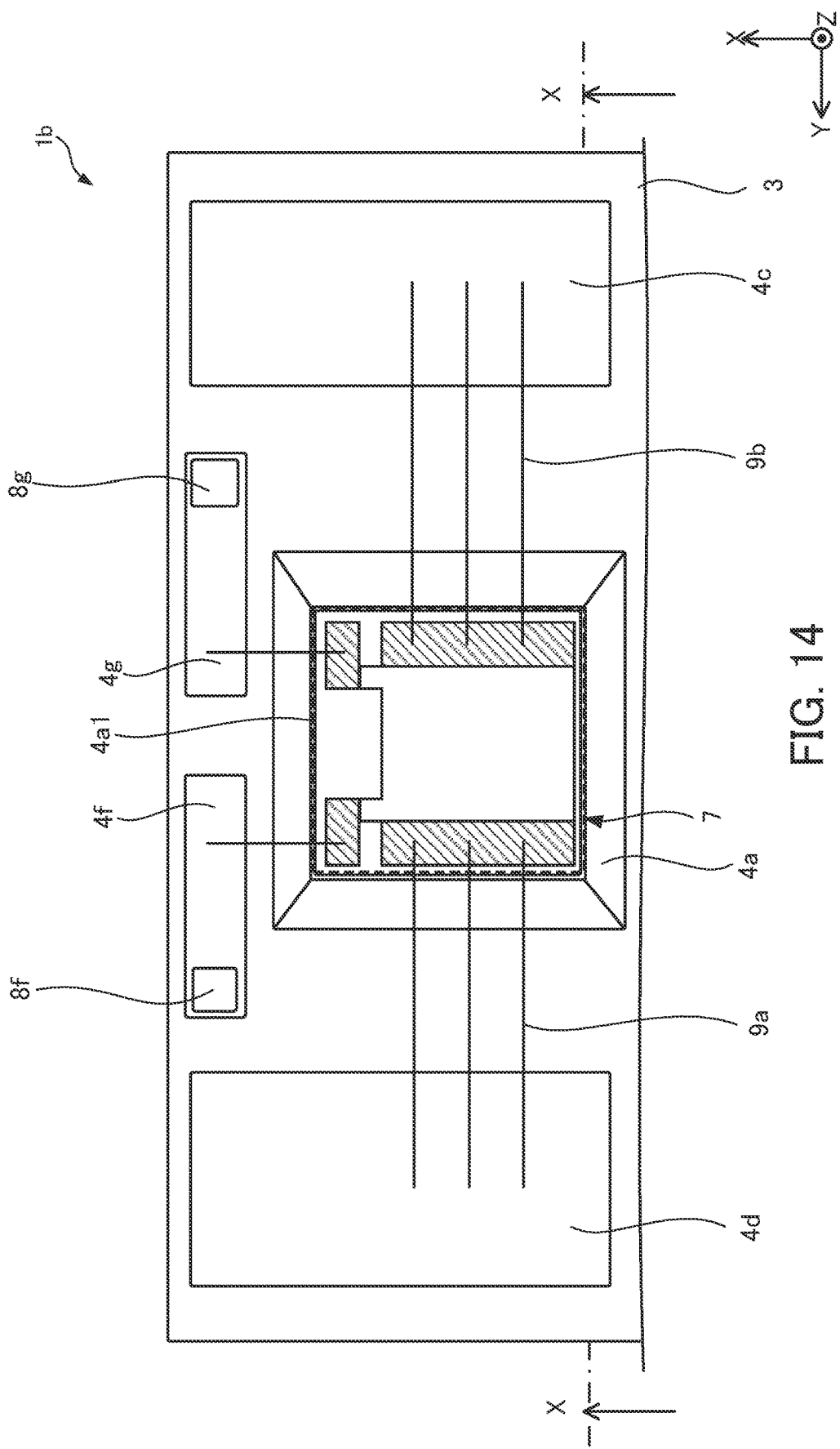
FIG. 14 is a fragmentary plan view of a semiconductor device according to a third embodiment.
Figure 15:
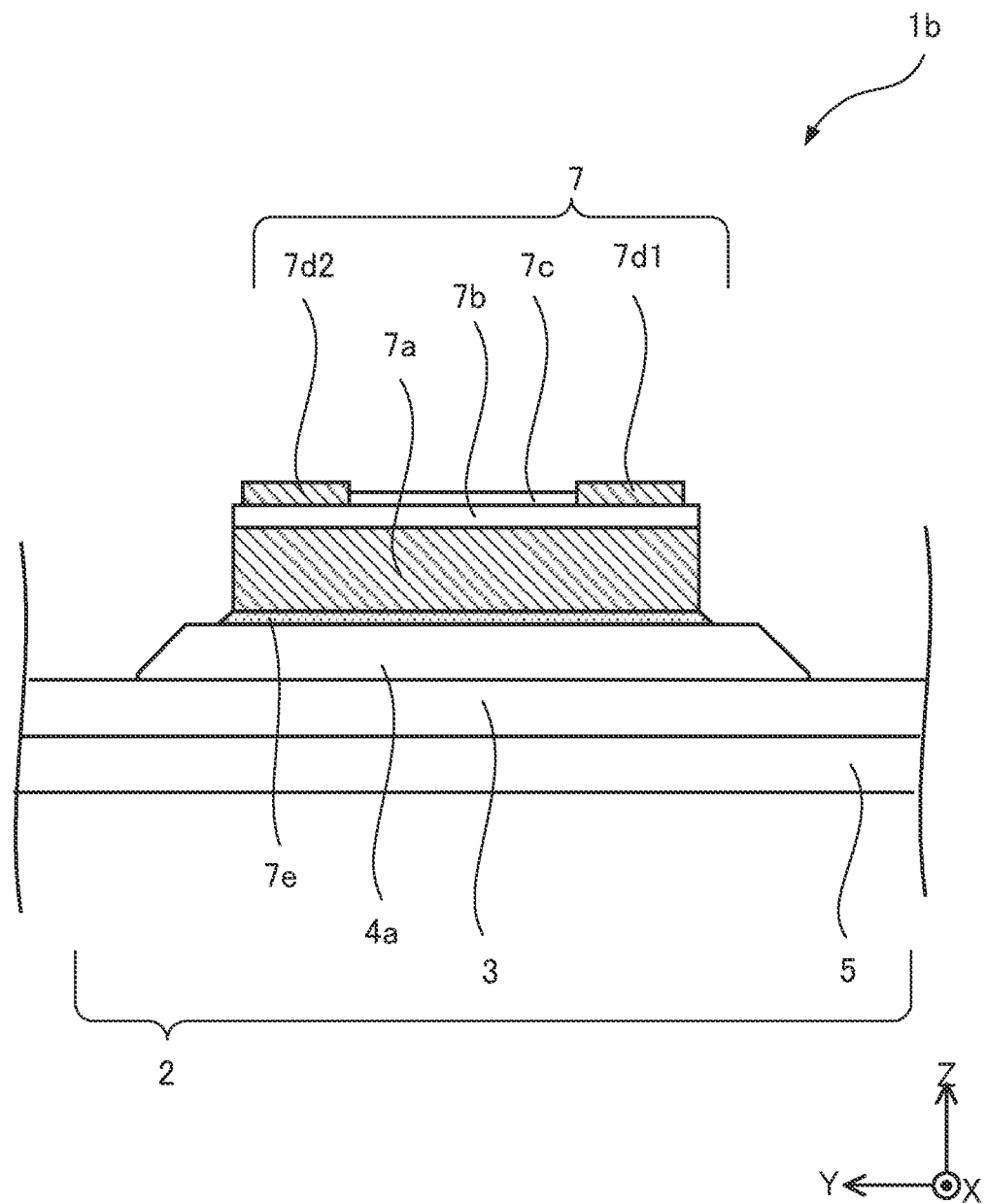
FIG. 15 is a fragmentary sectional view of the semiconductor device according to the third embodiment.

A semiconductor device according to a third embodiment will be described by the use of FIG. 14 and FIG. 15. FIG. 14 is a fragmentary plan view of a semiconductor device according to a third embodiment. FIG. 15 is a fragmentary sectional view of the semiconductor device according to the third embodiment. FIG. 14 is an enlarged plan view of the vicinities of a resistance element 7 of a semiconductor device 1b. FIG. 15 is an enlarged sectional view of the vicinities of the resistance element 7 taken along the dot-dash line X-X of FIG. 14. In the third embodiment a change made in the semiconductor device 1 according to the first embodiment will mainly be described. Furthermore, components of the semiconductor device 1b which are the same as those included in the semiconductor device 1 according to the first embodiment are marked with the same numerals and descriptions of them will be omitted or simplified.

With the semiconductor device 1 according to the first embodiment the resistance element 7 is arranged over the circuit pattern 4a. With the semiconductor device 1b according to the third embodiment, the back surface of a circuit pattern 4a is larger than the front surface of the circuit pattern 4a and each side portion is inclined. That is to say, a bonding area 4a1 to which the resistance element 7 is bonded is set on the front surface of the circuit pattern 4a in the third embodiment and the circuit pattern 4a in the third embodiment has a trapezoidal shape in side view.

In the case of the first embodiment, as stated above, stress is applied to the insulating plate 3 under the corner portions of the back surface of the circuit pattern 4a according to expansion and contraction of the circuit pattern 4a and a crack tends to appear to the inside of the insulating plate 3. On the other hand, with the circuit pattern 4a in the third embodiment the back surface is situated outside the front surface in plan view. As a result, stress applied from each corner portion of the back surface of the circuit pattern 4a to the insulating plate 3 is relaxed and the appearance of a crack is suppressed. Accordingly, as the back surface of the circuit pattern 4a is made larger than the front surface of the circuit pattern 4a, stress applied to the insulating plate 3 is dispersed and stress applied to a specific area of the insulating plate 3 is relaxed. However, this depends on the layout of circuit patterns 4.

As with the second embodiment and each modification of the second embodiment, a concave portion may be formed in the circuit pattern 4a or a metal block 7a of the semiconductor device 1b according to the third embodiment. This prevents the occurrence of damage to an insulated circuit board 2 more reliably and also improves bonding strength between the resistance element 7 and the circuit pattern 4a. Accordingly, deterioration in the reliability of the semiconductor device 1b is also suppressed more reliably.

Fourth Embodiment

Figure 16:
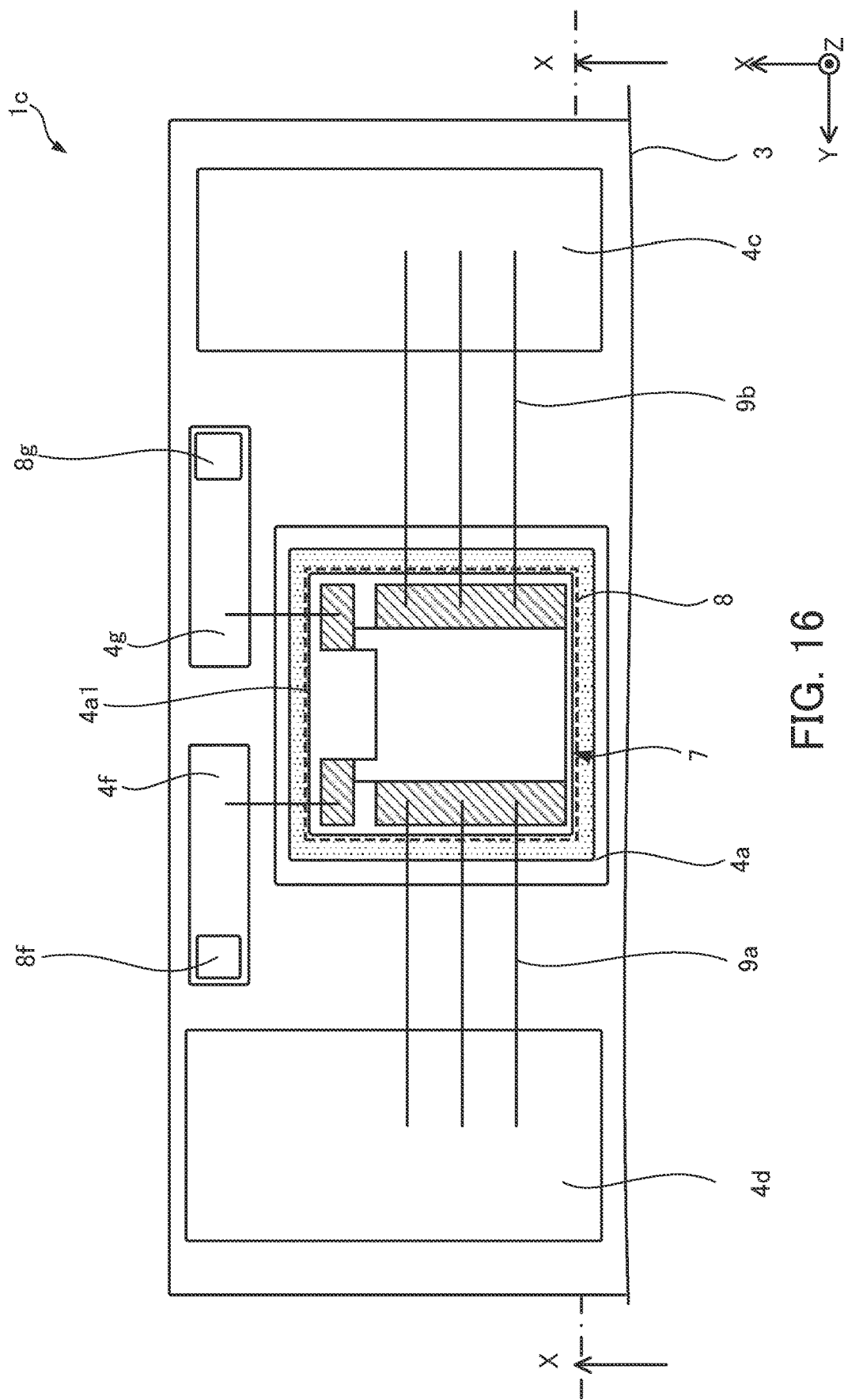
FIG. 16 is a fragmentary plan view of a semiconductor device according to a fourth embodiment.
Figure 17:
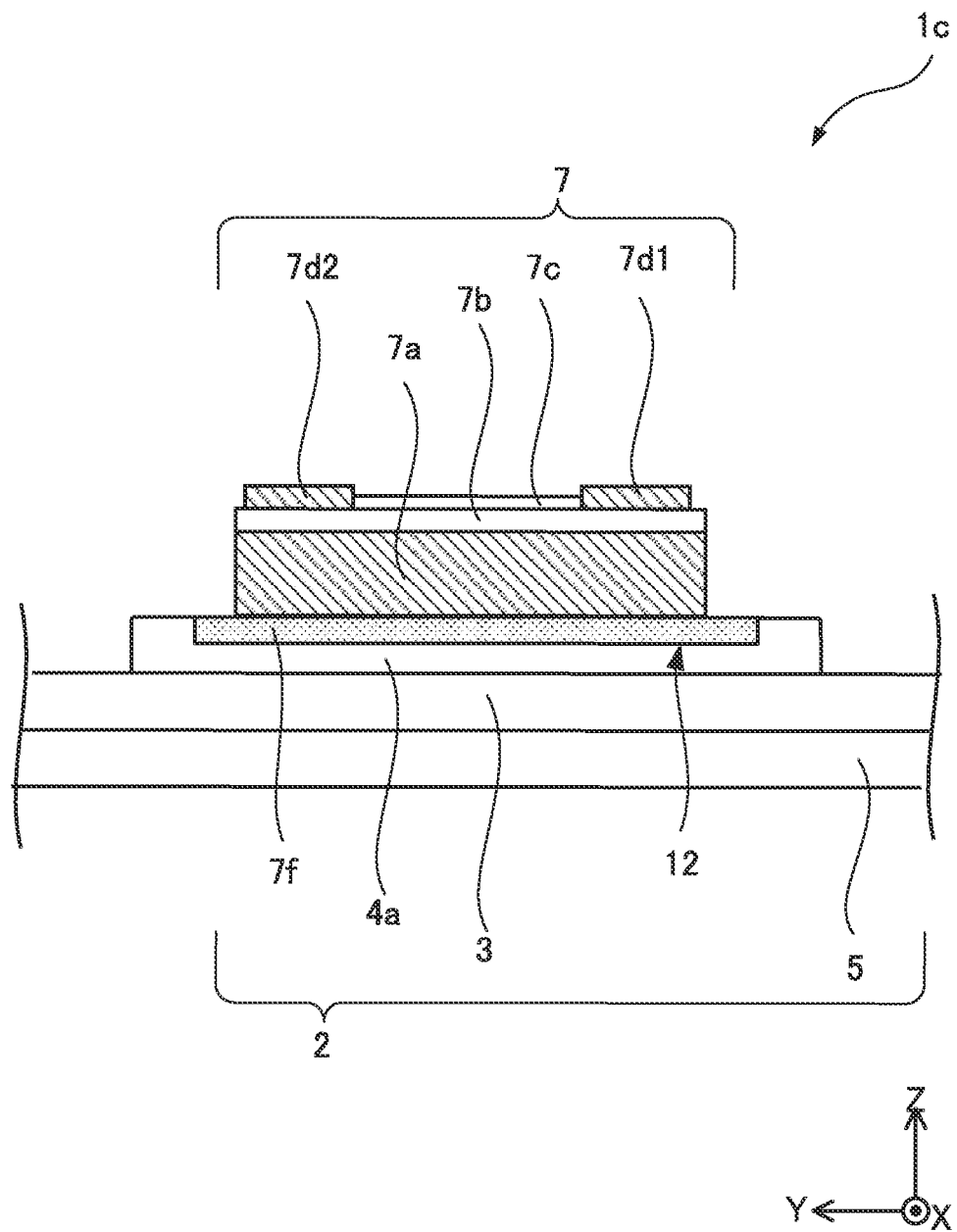
FIG. 17 is a fragmentary sectional view of the semiconductor device according to the fourth embodiment.

A semiconductor device according to a fourth embodiment will be described by the use of FIG. 16 and FIG. 17. FIG. 16 is a fragmentary plan view of a semiconductor device according to a fourth embodiment. FIG. 17 is a fragmentary sectional view of the semiconductor device according to the fourth embodiment. FIG. 16 is an enlarged plan view of the vicinities of a resistance element 7 of a semiconductor device 1c. FIG. 17 is an enlarged sectional view of the vicinities of the resistance element 7 taken along the dot-dash line X-X of FIG. 16. In the fourth embodiment a change made in the semiconductor device 1 according to the first embodiment will mainly be described. Furthermore, components of the semiconductor device 1c which are the same as those included in the semiconductor device 1 according to the first embodiment are marked with the same numerals and descriptions of them will be omitted or simplified.

With the semiconductor device 1c according to the fourth embodiment, a concave portion 12 is formed in the front surface of the circuit pattern 4a of the semiconductor device 1 according to the first embodiment and therefore an area including the bonding area 4a1 to which the resistance element 7 is bonded is concave. A relaxation layer 7f is formed in the concave portion 12 and the resistance element 7 is bonded to the relaxation layer 7f. At this time the relaxation layer 7f is solder. In particular, a material, such as tin-based solder, having small yield stress may be used.

With the semiconductor device 1c according to the fourth embodiment, the relaxation layer 7f is formed in the concave portion 12 formed in the circuit pattern 4a and the resistance element 7 is arranged thereover. As a result, the relaxation layer 7f is thick compared with the bonding member 7e in the first embodiment. Accordingly, distortion at the time of expansion and contraction of the circuit pattern 4a is absorbed by the relaxation layer 7f, stress applied to an insulating plate 3 is relaxed, and the appearance of a crack in the insulating plate 3 is prevented.

Furthermore, the area of the concave portion 12 formed in the circuit pattern 4a may be at least the same in plan view as that of the bonding area 4a1 of the circuit pattern 4a to which the resistance element 7 is bonded. Alternatively, the area of the concave portion 12 may be larger in plan view than that of the bonding area 4a1 of the circuit pattern 4a to which the resistance element 7 is bonded. Each corner portion of the concave portion 12 may have an R-shape in plan view. In addition, the concave portion 12 does not pierce the circuit pattern 4a. The depth of the concave portion 12 is set to a degree that the strength of the circuit pattern 4a does not lower. The depth of the concave portion 12 is greater than or equal to 30 percent of the thickness of the circuit pattern 4a and smaller than or equal to 60 percent of the thickness of the circuit pattern 4a. Moreover, as long as the relaxation layer 7f has a determined thickness, the back surface of a metal block 7a may enter the circuit pattern 4a so as to be located closer to the insulating plate 3 (in the −Z direction) below the front surface of the circuit pattern 4a. As a result, the back surface of the metal block 7a and the lower parts of the sides of the metal block 7a closer to the back surface thereof are bonded with the relaxation layer 7f and bonding strength between the metal block 7a and the circuit pattern 4a is improved.

Fifth Embodiment

Figure 18:
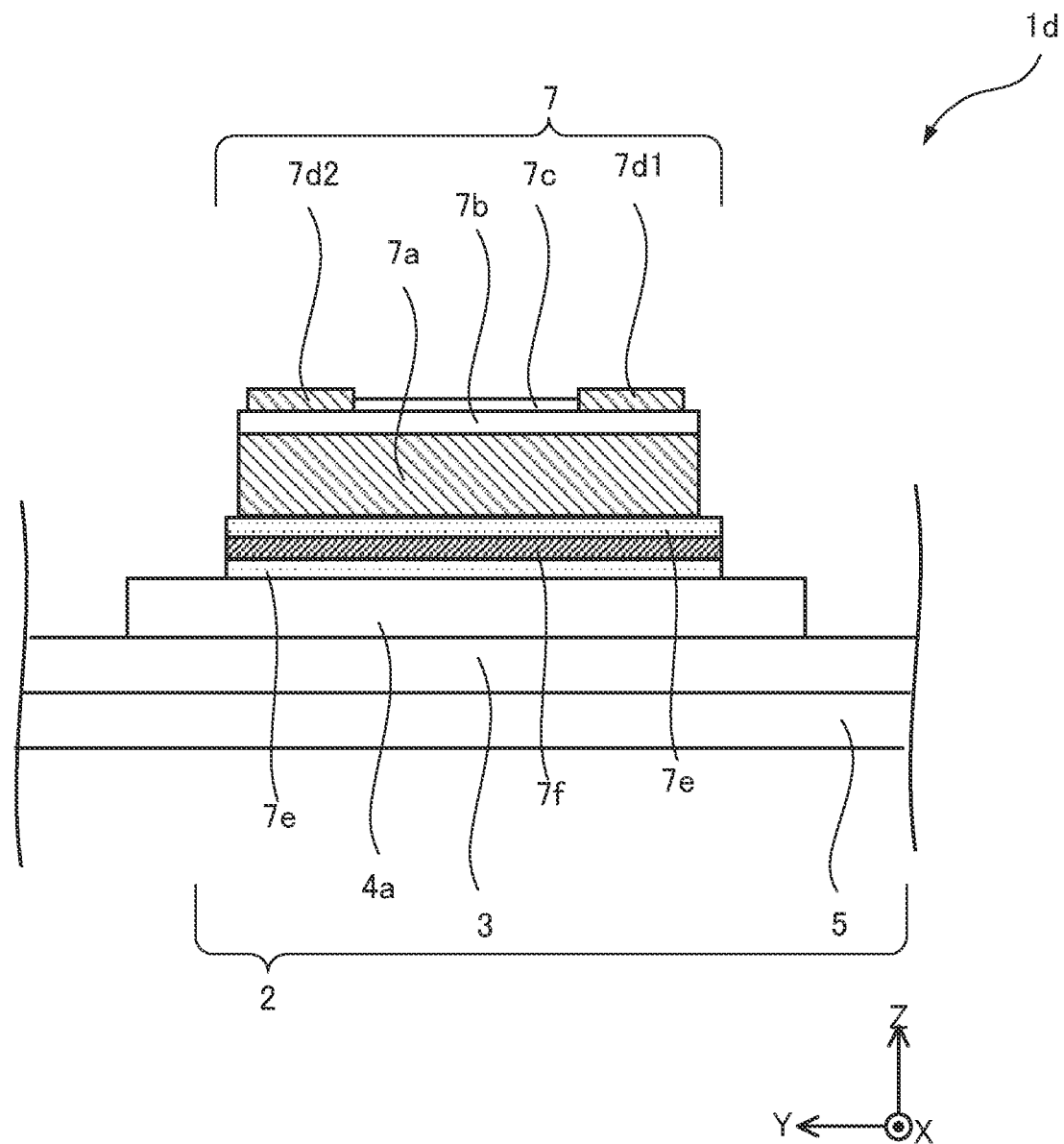
FIG. 18 is a fragmentary sectional view of a semiconductor device according to a fifth embodiment.

A semiconductor device according to a fifth embodiment will be described by the use of FIG. 18. FIG. 18 is a fragmentary sectional view of a semiconductor device according to a fifth embodiment. FIG. 3 may be referred to for a plan view corresponding to FIG. 18. FIG. 18 corresponds to a section of the vicinities of the resistance element 7 taken along the dot-dash line X-X of FIG. 3. In the fifth embodiment a change made in the semiconductor device 1 according to the first embodiment will mainly be described. Furthermore, components of a semiconductor device 1d which are the same as those included in the semiconductor device 1 according to the first embodiment are marked with the same numerals and descriptions of them will be omitted or simplified.

With the semiconductor device 1d according to the fifth embodiment a relaxation layer 7f is formed between bonding members 7e with which the resistance element 7 is bonded to the circuit pattern 4a in the semiconductor device 1 according to the first embodiment. The relaxation layer 7f contains as a main component a material which is smaller in linear expansion coefficient than a metal block 7a and a circuit pattern 4a. Such a material is metal such as molybdenum or Invar. Furthermore, the thickness of the relaxation layer 7f is greater than or equal to 10 μm and smaller than or equal to 100 μm.

The back surface of the metal block 7a may enter the bonding member 7e on the back surface of the metal block 7a so as to be located closer to an insulating plate 3 (in the −Z direction) below the front surface of the bonding member 7e. As a result, the back surface of the metal block 7a and the lower parts of the sides of the metal block 7a are bonded with the bonding member 7e and bonding strength between the metal block 7a and the circuit pattern 4a is improved.

With the semiconductor device 1d according to the fifth embodiment the circuit pattern 4a attempts to expand and contract according to heat generated by the resistance element 7. At this time the circuit pattern 4a is put between the relaxation layer 7f, which is smaller in linear expansion coefficient than the circuit pattern 4a, and the insulating plate 3. This suppresses expansion and contraction of the circuit pattern 4a. Accordingly, stress applied to the insulating plate 3 is relaxed and the appearance of a crack in the insulating plate 3 is prevented.

The relaxation layer 7f put between the bonding members 7e may be formed in the concave portion 12 of the circuit pattern 4a in the fourth embodiment. In this case, stress applied to the insulating plate 3 is also relaxed and the appearance of a crack in the insulating plate 3 is also prevented.

Sixth Embodiment

Figure 19:
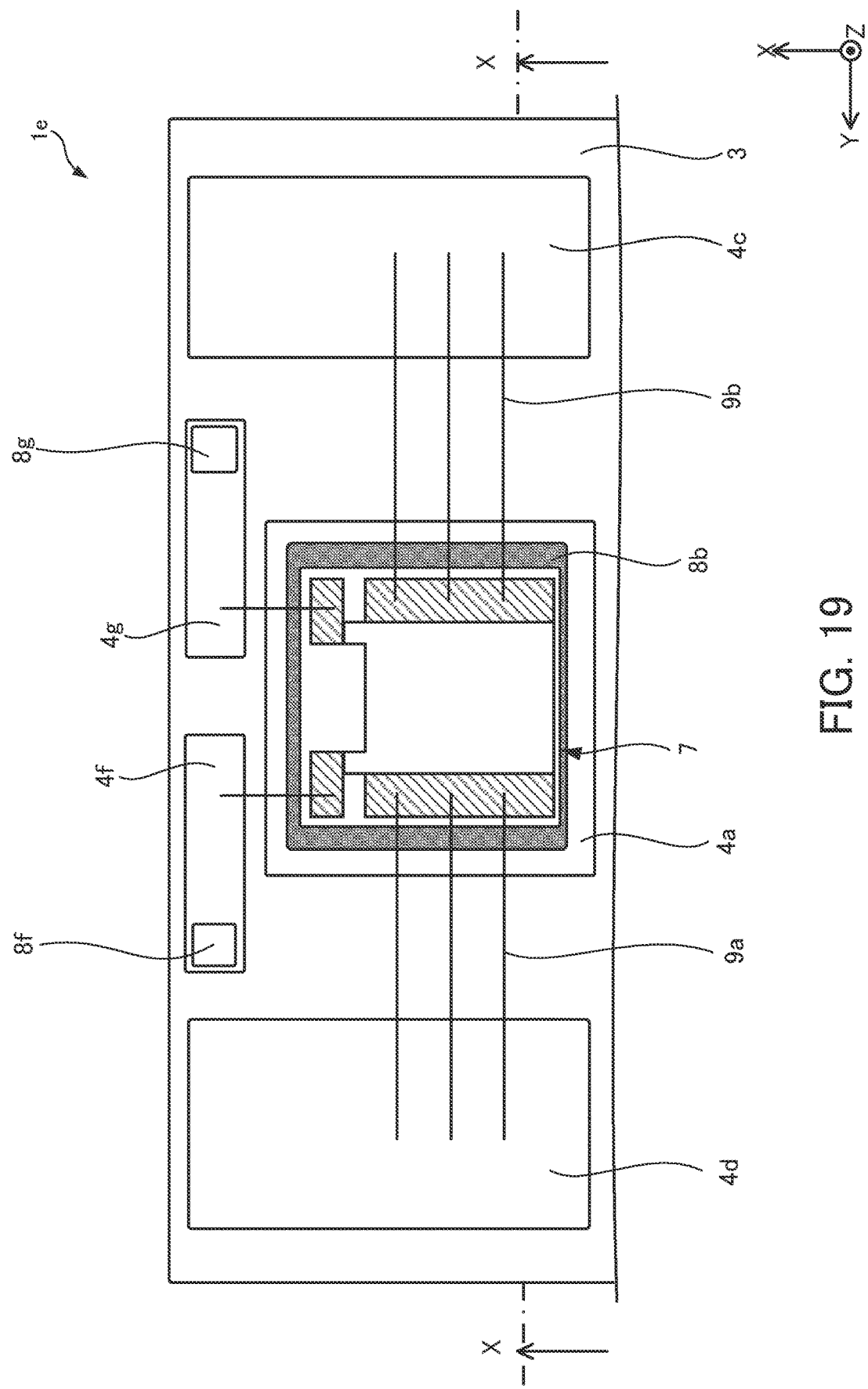
FIG. 19 is a fragmentary plan view of a semiconductor device according to a sixth embodiment.
Figure 20:
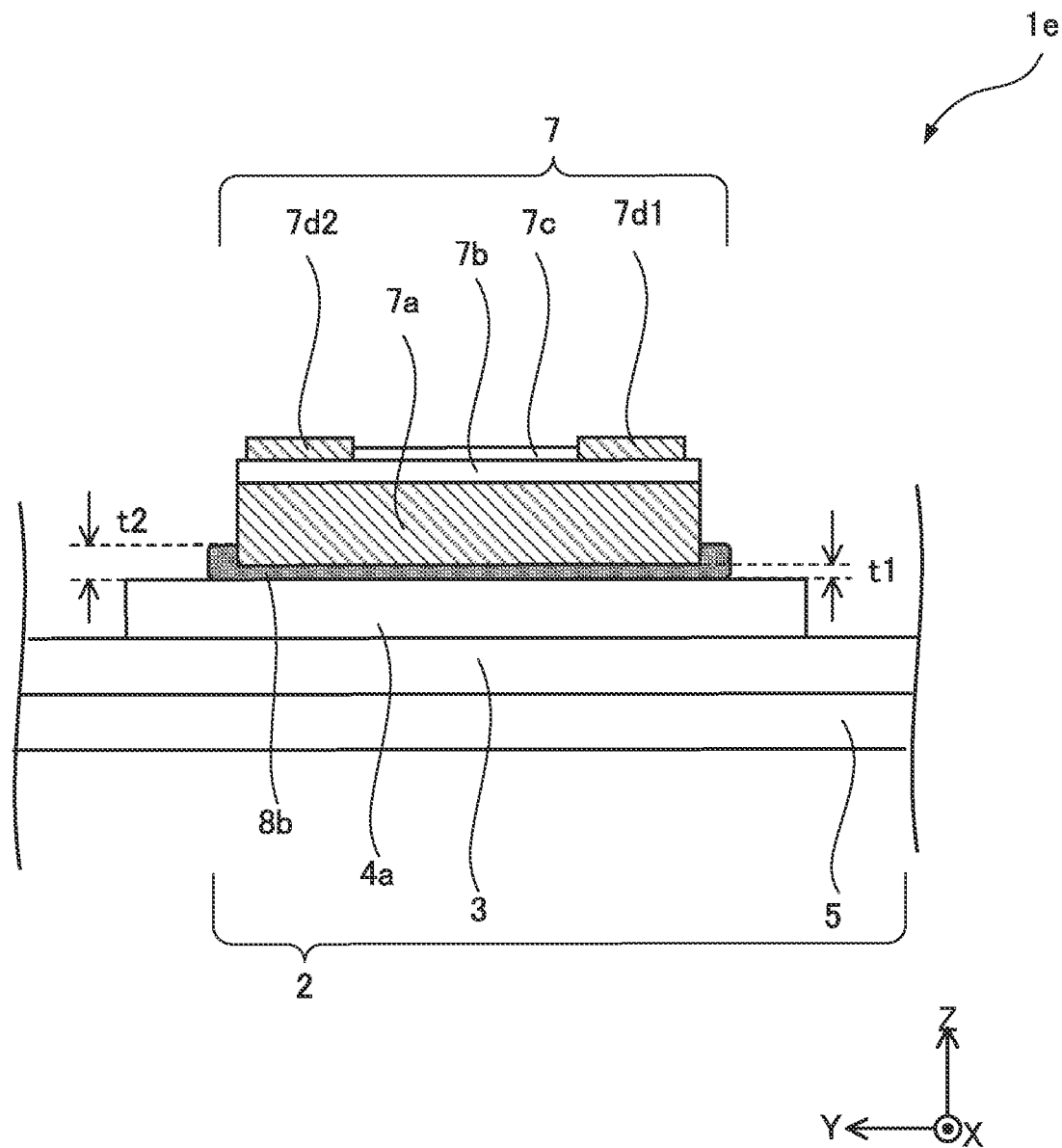
FIG. 20 is a fragmentary sectional view of the semiconductor device according to the sixth embodiment.

A semiconductor device according to a sixth embodiment will be described by the use of FIG. 19 and FIG. 20. FIG. 19 is a fragmentary plan view of a semiconductor device according to a sixth embodiment. FIG. 20 is a fragmentary sectional view of the semiconductor device according to the sixth embodiment. FIG. 19 is an enlarged plan view of the vicinities of a resistance element 7 of a semiconductor device 1e. FIG. 20 is an enlarged sectional view of the vicinities of the resistance element 7 taken along the dot-dash line X-X of FIG. 19. In the sixth embodiment a change made in the semiconductor device 1 according to the first embodiment will mainly be described. Furthermore, components of the semiconductor device 1e which are the same as those included in the semiconductor device 1 according to the first embodiment are marked with the same numerals and descriptions of them will be omitted or simplified.

With the semiconductor device 1e according to the sixth embodiment a relaxation layer 8b is formed between the resistance element 7 and the circuit pattern 4a in the semiconductor device 1 according to the first embodiment. The relaxation layer 8b is an adhesive containing as a main component silicone or the like. The relaxation layer 8b is formed between the back surface of a metal block 7a and the front surface of a circuit pattern 4a and on the lower parts of the sides (on the outer periphery) of the metal block 7a. The thickness t1 of the relaxation layer 8b formed between the back surface of the metal block 7a and the front surface of the circuit pattern 4a is smaller than or equal to 10 μm and is preferably smaller than or equal to 2 μm. Furthermore, the thickness t2 of the relaxation layer 8b formed on the sides (on the outer periphery) of the metal block 7a is greater than thickness t1 and is smaller than or equal to 0.8 times the thickness of the metal block 7a. If the relaxation layer 8b is too thick, then the relaxation layer 8b spreads over a surface (X-Y plane) and may flow down the circuit pattern 4a.

With the semiconductor device 1e according to the sixth embodiment the circuit pattern 4a attempts to expand and contract according to heat generated by the resistance element 7. At this time distortion caused by deformation of the circuit pattern 4a which expands and contracts is absorbed by the relaxation layer 8b. Accordingly, stress applied to an insulating plate 3 is relaxed and the appearance of a crack in the insulating plate 3 is prevented.

The relaxation layer 8b may be formed in the concave portion 12 of the circuit pattern 4a in the fourth embodiment. In this case, stress applied to the insulating plate 3 is also relaxed and the appearance of a crack in the insulating plate 3 is also prevented.

According to the disclosed techniques, deterioration in the heat dissipation property of an insulated circuit board over which a resistance element is arranged is suppressed and a semiconductor device for which deterioration in reliability is suppressed is provided.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   a resistance element including a metal block, a resin layer disposed on the metal block, and a resistance film disposed on the resin layer; and
   an insulated circuit board including
      an insulating plate, and
      a circuit pattern having a front surface, the circuit pattern being disposed on the insulating plate and having a bonding area on the front surface of the circuit pattern to which a back surface of the metal block of the resistance element is bonded, an area of the circuit pattern being larger in a plan view of the semiconductor device than an area of the resistance element, wherein
      the metal block has a thickness greater than a thickness of the circuit pattern in a direction orthogonal to the back surface of the metal block.

2. The semiconductor device according to claim 1, wherein one or more first concavities are formed at the front surface of the circuit pattern.

3. The semiconductor device according to claim 2, wherein
   the bonding area has a rectangular shape with four corners in the plan view, and
   the one or more first concavities includes a plurality of first concavities that are respectively disposed in corner areas corresponding to the four corners of the bonding area.

4. The semiconductor device according to claim 3, wherein a plurality of second concavities is disposed along an outer periphery of the front surface of the circuit pattern, between two of the corner areas that are adjacent to each other.

5. The semiconductor device according to claim 4, wherein a plurality of third concavities is formed in an area inside the outer periphery of the front surface of the circuit pattern.

6. The semiconductor device according to claim 5, wherein a total volume of the first, second, and third concavities is in a range of 0.8 times to 1.2 times a volume of the metal block.

7. The semiconductor device according to claim 5, wherein:
the resistance element is bonded to the bonding area with a bonding material; and
the first, second, and third concavities formed in the bonding area are also filled with the bonding material.

8. The semiconductor device according to claim 3, wherein at least one of the one or more first concavities overlap an outer periphery of the bonding area in the plan view.

9. The semiconductor device according to claim 2, wherein:
the resistance element includes main current electrodes provided at each of opposite sides of the resistance film disposed on the resin layer; and
at least one of the one or more first concavities is respectively provided along the main current electrodes in the back surface of the metal block under each of the main current electrodes.

10. The semiconductor device according to claim 9, wherein the one or more first concavities form a continuous loop shape along an outer periphery of the back surface of the metal block, the outer periphery including an area under the main current electrodes of the back surface of the metal block.

11. The semiconductor device according to claim 1, wherein:
a size of a back surface of the circuit pattern is larger than a size of a front surface of the circuit pattern in the plan view so that each side surface of the circuit pattern is inclined in a side view of the semiconductor device.

12. The semiconductor device according to claim 1, wherein the resistance element is bonded to the bonding area of the circuit pattern with a relaxation layer.

13. The semiconductor device according to claim 12, wherein:
the circuit pattern has a concave area including the bonding area and is recessed from the front surface of the circuit pattern toward the insulating plate; and
the relaxation layer is disposed in the concave area.

14. The semiconductor device according to claim 12, wherein the relaxation layer is solder.

15. The semiconductor device according to claim 12, wherein the relaxation layer contains as a main component a metal having a linear expansion coefficient smaller than linear expansion coefficients of the circuit pattern and the metal block.

16. The semiconductor device according to claim 15, wherein the metal is molybdenum or Invar.

17. The semiconductor device according to claim 12, wherein the relaxation layer is an adhesive.

18. The semiconductor device according to claim 12, wherein the relaxation layer is disposed between the resistance element and the bonding area of the circuit pattern, and along an outer periphery of the resistance element adjacent to the circuit pattern.

* * * * *